(12) United States Patent
Roitman et al.

(10) Patent No.: US 10,767,016 B2
(45) Date of Patent: Sep. 8, 2020

(54) VAPOR-PHASE CURING CATALYSIS AND PASSIVATION OF SILOXANE RESINS IN LED APPLICATIONS

(71) Applicant: Lumileds LLC, San Jose, CA (US)

(72) Inventors: Daniel B. Roitman, Menlo Park, CA (US); Danielle R. Chamberlin, Belmont, CA (US); David S. Roberts, Alameda, CA (US)

(73) Assignee: LUMILEDS LLC, San Jose, CA (US)

( * ) Notice: Subject to any disclaimer, the term of this patent is extended or adjusted under 35 U.S.C. 154(b) by 1 day.

(21) Appl. No.: 16/076,844

(22) PCT Filed: Feb. 8, 2017

(86) PCT No.: PCT/US2017/017033
§ 371 (c)(1),
(2) Date: Aug. 9, 2018

(87) PCT Pub. No.: WO2017/139387
PCT Pub. Date: Aug. 17, 2017

(65) Prior Publication Data
US 2019/0055361 A1 Feb. 21, 2019

Related U.S. Application Data
(60) Provisional application No. 62/293,741, filed on Feb. 10, 2016.

(30) Foreign Application Priority Data
Mar. 22, 2016 (EP) .................................... 16161552

(51) Int. Cl.
*C08J 5/18* (2006.01)
*C08G 77/08* (2006.01)
(Continued)

(52) U.S. Cl.
CPC ............. *C08G 77/08* (2013.01); *C08G 77/06* (2013.01); *C08J 5/18* (2013.01); *C09K 11/02* (2013.01);
(Continued)

(58) Field of Classification Search
None
See application file for complete search history.

(56) References Cited

U.S. PATENT DOCUMENTS

| | | | |
|---|---|---|---|
| 4,336,364 A | 6/1982 | Maxson | |
| 4,343,924 A | 8/1982 | Linden | |

(Continued)

FOREIGN PATENT DOCUMENTS

| | | | | |
|---|---|---|---|---|
| JP | 60129166 | * | 7/1985 | ............... B05D 3/04 |
| JP | H08176500 | | 7/1996 | |
| JP | 2010-090292 | | 4/2010 | |

OTHER PUBLICATIONS

Machine translation of JP 60-129166, translation generated Dec. 2019, 7 pages. (Year: 2019).*

(Continued)

*Primary Examiner* — Robert S Loewe

(57) ABSTRACT

The present invention encompasses materials and methods for catalyzing the cross-linking and curing of siloxane polymers. In particular, the present disclosure provides materials, methods, and conditions for vapor phase catalysis for curing organosiloxane polymers and resins, including resin linear organosiloxane block copolymers, as well as the incorporation of those methods into processes for making light emitting devices, including light emitting diodes.

20 Claims, 13 Drawing Sheets

(51) Int. Cl.
*H01L 33/50* (2010.01)
*H01L 33/56* (2010.01)
*C08G 77/06* (2006.01)
*C09K 11/02* (2006.01)
*C09K 11/08* (2006.01)

(52) U.S. Cl.
CPC ........ *C09K 11/0883* (2013.01); *H01L 33/501* (2013.01); *H01L 33/56* (2013.01); *C08J 2383/04* (2013.01); *H01L 2933/005* (2013.01); *H01L 2933/0041* (2013.01)

(56) References Cited

U.S. PATENT DOCUMENTS

| | | | | |
|---|---|---|---|---|
| 4,977,222 | A | * | 12/1990 | Bargigia ................. C08J 3/247 525/359.3 |
| 4,983,425 | A | * | 1/1991 | Vara ....................... B05D 3/046 427/340 |
| 8,003,169 | B2 | | 8/2011 | Misev et al. |
| 2001/0041219 | A1 | | 11/2001 | Durand et al. |
| 2012/0231447 | A1 | | 9/2012 | Zhang et al. |
| 2012/0258259 | A1 | * | 10/2012 | Bansal ................. C23C 16/4401 427/558 |
| 2013/0168727 | A1 | | 7/2013 | Horstman et al. |
| 2013/0171354 | A1 | | 7/2013 | Horstman et al. |
| 2013/0231438 | A1 | | 9/2013 | Kim et al. |
| 2013/0245187 | A1 | | 9/2013 | Swier et al. |
| 2014/0342166 | A1 | | 11/2014 | Yang et al. |
| 2015/0001567 | A1 | * | 1/2015 | Amako ................. H01L 33/501 257/98 |
| 2016/0032148 | A1 | * | 2/2016 | Amako ................... B29C 43/00 156/60 |
| 2018/0159001 | A1 | * | 6/2018 | Schricker ................ H01L 33/56 |

OTHER PUBLICATIONS

Machine translation of JP-2010090292, translation generated Apr. 2020, 52 pages. (Year: 2020).*

* cited by examiner

VAPOR-PHASE CURING CATALYSIS AND PASSIVATION OF SILOXANE RESINS IN LED APPLICATIONS

CROSS-REFERENCE TO RELATED APPLICATIONS

The present application claims priority to U.S. Provisional Patent Application No. 62/293,741, filed Feb. 10, 2016 and European Patent Application No. 16161552.1 filed Mar. 22, 2016. U.S. Provisional Patent Application No. 62/293,741 and European Patent Application No. 16161552.1 are incorporated herein.

FIELD

The present disclosure provides methods for catalyzing the curing of siloxane polymers. In particular, the present disclosure provides materials, methods, and conditions for vapor phase catalysis for curing organosiloxane polymers and resins and the incorporation of those methods into processes for making light emitting devices, including light emitting diodes.

BACKGROUND

Siloxane polymers, organosiloxane polymers, and siloxane resins are used in the manufacture of, inter alia, light emitting devices, including, for example, those employing light emitting diodes (LEDs). These organosiloxane materials can be used, e.g., as binders or as encapsulating materials in the manufacture of such devices.

Improper, incomplete, insufficient, or irreproducible curing of organosiloxane polymers and resins in encapsulation applications, including but not limited to the preparation of phosphor binders in the manufacture of LED devices, can provide an unstable intermediate result. Unstable compounds in turn may result in products characterized by limited shelf life and/or limited service life. Accordingly, particularly in view of the widespread use of LEDs in the many forms and types of light emitting devices in the market, there is a need for efficient and reliable methods for the manufacture of LEDS, including therefore, a need for reproducible, standardized, and controlled methods for curing siloxane polymers, organosiloxane polymers, and siloxane resins.

In addition, some organosiloxane polymers can be cured using normal methods. However, curing processes and/or molecular rearrangements may continue long after devices are sold and put into use. This processes, commonly described as thermal and/or photothermal aging, may change the polymer from a somewhat flexible material that can absorb the thermal excursions of a LED device to a brittle material that will crack, delaminate, or cause stress-induced cracks and/or defects of other LED components.

JP2010090292 A describes providing a polyorganosiloxane hardened product with less degradation and free from uneven hardening. A gaseous catalyst and a polyorganosiloxane are contacted in a glass vessel with a lid to produce a polyorganosiloxane hardened product.

SUMMARY

The inventive subject matter is defined by the accompanying independent claims, with specific embodiments defined in the accompanying dependent claims.

Especially, amongst others herein is provided in an aspect a method comprising: contacting a material with a first catalyst in a vapor phase, the material comprising: an uncured polymer; optionally a second catalyst; and particles that inhibit the second catalyst; and (during or) after said contacting a material, curing the uncured polymer. Especially, the polymer comprises an (organo)siloxane polymer.

In specific embodiments, the material is formed into a film, and wherein the method further comprises laminating the film over a light emitting diode.

In specific embodiments, the first catalyst in a vapor phase comprises one or more of 1,8-diazabicyclo[5.4.0]undec-7-ene (DBU), bis(dimethylamino)diethylsilane (Bis-DMADES), and aminopropyl trimethoxysilane (APTMS).

Alternatively or additionally, in specific embodiments the first catalyst in a vapor phase comprises one or more of pyridine and acetoxyethyl trimethoxysilane (AETMS).

In embodiments, the first catalyst comprises one or more of an acid and a base.

In specific embodiments, the particles that inhibit the (optional) second catalyst comprise a wavelength converting material, such as especially a nitride phosphor.

In specific embodiments, "curing the uncured polymer" comprises causing a process that crosslinks the polymer, the method further comprising after causing a process that crosslinks the polymer, contacting the material with a one or more of a first catalyst and a second catalyst in a vapor phase, wherein the (one or more of a first catalyst and a second) catalyst retards the process that crosslinks the polymer.

In yet further specific embodiments the uncured polymer comprises a siloxane; and curing comprises causing one of ring-opening polymerization and condensation polymerization.

In a further aspect, the invention provides a method comprising: providing a film comprising an uncured polymer and particles of material; contacting the film with a catalyst in a vapor phase such that the catalyst infuses into the film; and (during or) after said contacting the film, curing the uncured polymer.

In specific embodiments the infused catalyst at least partially decomposes during or after said curing the uncured polymer.

In specific embodiments, the infused catalyst at least partially volatilizes during or after said curing the uncured polymer.

In specific embodiments, the infused catalyst is not irreversibly incorporated into the film.

In specific embodiments, prior to said contacting the material, the material is substantially free of catalyst.

In specific embodiments, the particles of material are particles of wavelength converting material, and wherein providing a film comprises mixing the particles of wavelength converting material with the uncured polymer and casting the mixture into a film.

In specific embodiments, the first catalyst in a vapor phase comprises one or more of 1,8-diazabicyclo[5.4.0]undec-7-ene (DBU), bis(dimethylamino)diethylsilane (Bis-DMADES), and aminopropyl trimethoxysilane (APTMS).

In further specific embodiments, the curing may comprise contacting an uncured ((organo)siloxane) polymer with the catalyst in a vapor phase as well exposure to a plasma, under conditions sufficient to provide an uncured treated ((organo) siloxane) polymer, that is then cured at a temperature and for a time sufficient to provide a cured ((organo)siloxane) polymer.

The invention(s) is defined herein especially in relation to uncured (organo)siloxane polymer may in specific embodiments also be applied as well to partially cured (organo) siloxane polymers.

DETAILED DESCRIPTION

Figure 1:
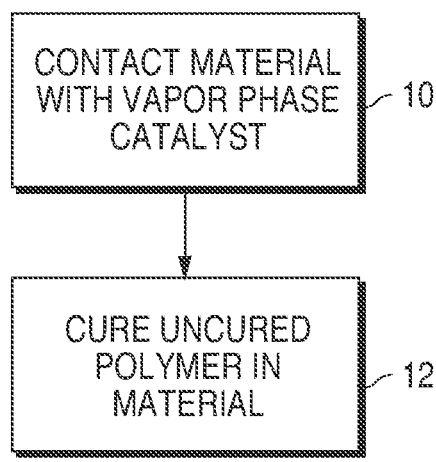
FIG. 1 and FIG. 2 illustrate methods of contacting materials with vapor phase catalysts and curing uncured polymers in the materials.

Embodiments of the invention include a first method for catalyzing the curing of siloxane polymers or any other suitable materials, and a second method that halts or retards the curing of siloxane polymers or any other suitable materials. In specific embodiments, the present disclosure provides materials, methods, and conditions for vapor phase catalysis for curing and/or inhibition thereof of organosiloxane polymers and resins. The present disclosure also describes processes for making light emitting devices, including LEDs, which incorporate the methods for vapor phase catalysis for curing organosiloxane polymers and resins disclosed herein.

One embodiment is a method for catalysis of organosiloxane polymer curing, comprising contacting an uncured or partially cured organosiloxane polymer with a vapor phase catalyst under conditions sufficient to provide an uncured treated polymer that is then cured at a temperature and for a time sufficient to provide a cured organosiloxane polymer. According to this method, curing occurs at a lower temperature and/or in a shorter time as compared to a control method not including the contacting step.

In one aspect of this embodiment, the vapor phase catalyst comprises an organic base, such as, 1,8-diazabicyclo[5.4.0] undec-7-ene (DBU), with pKa~13.2. In another aspect of this embodiment, the vapor phase catalyst comprises a silane-organic base such as aminopropyl trimethoxysilane (APTMS) with pKa~and bis(dimethylamino)diethylsilane (Bis-DMADES), with pKa~11 (for the dimethylamine leaving group).

In aspects of this embodiment, the uncured organosiloxane polymer is a linear organosilane polymer, a cyclic organosiloxane polymer, a branched organosiloxane polymer, an organosiloxane resin, a resin-linear organosiloxane block copolymer (RLOBC), or a combination of two or more thereof.

Another embodiment is a method for catalysis of organosiloxane polymer curing, in which the uncured organosiloxane polymer is in the form of a composition. In specific aspects of this embodiment, that formulation may further comprise a phosphor, filler, optical modifier, rheology modifier, or a combination of two or more thereof.

Another embodiment is a method for catalysis of organosiloxane polymer curing, in which the uncured organosiloxane polymer is in the form of a film.

Another embodiment is a method for catalysis of organosiloxane polymer curing comprising contacting an uncured organosiloxane polymer with a vapor phase catalyst as well exposure to a plasma, under conditions sufficient to provide an uncured treated organosiloxane polymer, that is then cured at a temperature and for a time sufficient to provide a cured organosiloxane polymer. In one aspect of this embodiment, the plasma is a nitrogen ($N_2$) plasma. In another aspect of this embodiment, the contacting comprises sequential exposure to the vapor phase catalyst followed by exposure to the plasma.

Another embodiment is method for catalysis of organosiloxane polymer curing comprising contacting an uncured organosiloxane polymer with a vapor phase catalyst, followed by removal of the vapor phase catalyst after curing, for example, by exposure to a vacuum at room temperature (RT) or at elevated temperatures (e.g., 50° C.).

Embodiments of the invention may be applied to uncured or partially cured organosiloxane polymers that comprise one or more silanol groups and/or one or more hydrolysable groups. Another embodiment of the invention may be applied to organosiloxane polymers that chain-extend and crosslink by ring opening polymerization. In one aspect of these embodiments, the uncured or partially cured organosiloxane polymer is in the form of a composition further comprising a condensation cure catalyst and/or ring-opening catalyst.

Another embodiment is a method for making a light emitting device, comprising providing a LED disposed on a surface, applying a composition comprising an uncured organosiloxane polymer to an emission surface of that LED, contacting the uncured organosiloxane polymer with a vapor phase catalyst under conditions sufficient to provide an uncured treated polymer, and curing the treated polymer at a temperature and for a time sufficient to provide a cured organosiloxane polymer. In one aspect of this embodiment, the curing occurs at a lower temperature and/or in a shorter time as compared to a control process not including said contacting step.

In one embodiment of a method for making a light emitting device, the vapor phase catalyst comprises a base or an acid. In certain aspects, the vapor phase catalyst may comprise an organic base, while in other aspects, the vapor phase catalyst may comprise an organic or inorganic acid.

In one embodiment of a method for making a light emitting device, the vapor phase catalyst comprises an organic amine and, in one aspect of this embodiment, the organic base, such as, for example, 1,8-diazabicyclo[5.4.0]undec-7-ene (DBU), with pKa~13.2. In another aspect of this embodiment, the vapor phase catalyst comprises a silane-organic base such as aminopropyl trimethoxysilane (APTMS) with pKa~and bis(dimethylamino)diethylsilane (Bis-DMADES), with pKa~11 (for the dimethylamine leaving group).

In another embodiment of a method for making a light emitting device, the uncured organosiloxane polymer is a linear organosilane polymer, a cyclic organosiloxane polymer, a branched organosiloxane polymer, an organosiloxane resin, a RLOBC, or a combination of two or more thereof.

In still another embodiment of a method for making a light emitting device, the uncured organosiloxane polymer is in the form of a film.

In a further embodiment of a method for making a light emitting device, the contacting step further comprises exposure to a plasma. In one aspect of this embodiment, the plasma is a $N_2$ plasma. In another aspect of this embodiment, the contacting step comprises sequential exposure to the vapor phase catalyst followed by exposure to the plasma.

Another embodiment is a lighting device prepared by providing a LED, applying a composition comprising an uncured organosiloxane polymer to an emission surface of that LED, contacting the uncured organosiloxane polymer with a vapor phase catalyst under conditions sufficient to provide an uncured treated organosiloxane polymer, and curing the treated polymer at a temperature and for a time sufficient to provide a cured organosiloxane polymer.

Another embodiment is a "post-curing" treatment to prevent or to slow the curing processes prior to embrittlement of siloxane encapsulants, e.g., photo-thermal aging. Such embrittlement can result from post-manufacture, continuing crosslinking and molecular rearrangements exhibited by LED encapsulants during operation (e.g., at high temperature).

Another embodiment is a method for further modulating organosiloxane polymer curing, a method that comprises contacting an uncured or partially cured organosiloxane polymer with a vapor phase accelerator, a vapor phase modulator, and/or a vapor phase inhibitor under conditions sufficient to provide an uncured treated polymer, and curing the treated polymer at a temperature and for a time sufficient to provide a cured organosiloxane polymer. In one aspect of this embodiment, the uncured or partially cured organosiloxane polymer is contacted with a vapor phase accelerator, such as, for example, APTMS, DBU, or Bis-DMADES.

In another embodiment, the uncured or partially cured organosiloxane polymer is contacted with a vapor phase modulator. In one aspect of this embodiment, in the presence of a first set of reagents and/or under a first set of conditions, the modulator inhibits curing of the organosiloxane polymer or acts as a plasticizer, such as, for example, pyridine and acetoxyethyl trimethoxysilane (AETMS). Another embodiment is a method comprising both catalysis of the curing of uncured or partially cured siloxane polymers as well as inhibition of curing of uncured or partially cured siloxane polymers, e.g., quenching of the continued cross-linking and curing of the siloxane polymers. In specific embodiments, the present disclosure provides materials, methods, and conditions for vapor phase catalysis for curing and/or inhibition thereof of organosiloxane polymers and resins, including RLOBCs. Other embodiments include processes for making light emitting devices, including LEDs, which incorporate the methods for vapor phase catalysis for curing organosiloxane disclosed herein Further areas of applicability of the present invention will become apparent from the detailed description provided hereinafter. It should be understood that the detailed description and specific examples are intended for purposes of illustration only and are not intended to limit the scope of the invention, its application, or uses.

Before describing in detail exemplary embodiments of the present invention, definitions important for understanding the present invention are provided below.

Unless defined otherwise, all technical and scientific terms used herein have the same meanings as commonly understood by one of ordinary skill in the art to which this invention belongs. Any methods and materials similar or equivalent to those described herein can be used in the practice or testing of the present invention. Preferred methods, devices and materials are now described. All publications mentioned herein are incorporated by reference for the purpose of describing and disclosing the materials and methodologies that are reported in the publication, which might be used in connection with the invention.

As used herein and in the appended claims, the singular forms "a", "an", and "the" include plural reference unless the context clearly dictates otherwise.

As used herein, the terms "organosiloxane polymer" and "organopolysiloxanes" refer to polymers containing siloxy units independently selected from $(R_3SiO_{1/2})$, $(R_2SiO_{2/2})$, $(RSiO_{3/2})$, or $(SiO_{4/2})$ siloxy units, where R may be any organic group. These siloxy units are commonly referred to as M, D, T, and Q units respectively. These siloxy units can be combined in various manners to form cyclic, linear, or branched structures.

As used herein, the term "linear organosiloxane polymer" refers to organosiloxane polymers that typically contain mostly D or $(R_2SiO_{2/2})$ siloxy units, which results in polydiorganosiloxanes that are fluids of varying viscosity, depending on the "degree of polymerization" or "dp" as indicated by the number of D units in the polydiorganosiloxane.

As used herein, the term "organosiloxane resin" refers to an organosiloxane polymer in which a majority of the siloxy units are selected from T or Q siloxy units.

As used herein, the term "resin-linear organosiloxane block copolymer" refers to a organopolysiloxane that contains "linear" D siloxy units in combination with "resin" T or Q siloxy units. A resin-linear organosiloxane block copolymer can be a random copolymer or a "block" copolymer (RLOBC), where the block copolymer contains D and T units, where the D units are primarily bonded together to form "linear blocks," e.g., having 10 to 400 D units and the T units are primarily bonded to each other to form branched polymeric chains, or "non-linear blocks. For example, various OH groups on the organosiloxane resin can be reacted with the hydrolysable groups on the linear organosiloxane, to form a resin-linear organosiloxane block copolymer. Examples of such hydrolysable groups include but are not limited to oximo, epoxy, carboxy, amino, amido groups, as well as those represented by the formula $R^1(C=O)O-$ where $R^1$ can be $C_1$ to $C_6$ alkyl group, such as methyl, ethyl, propyl, butyl, pentyl, or hexyl, e.g., an acetoxy group when $R^1$ is methyl.

As used herein, the term "phosphor" refers to wavelength converting materials that emit colors of light may that are added to light emitting devices (e.g., LEDs) to tailor the spectrum of light emitted from the device. Therefore, as used herein, the terms phosphor and phosphor particle encompass organic semiconductors, II-VI or III-V semiconductors, II-VI or III-V semiconductor quantum dots or nanocrystals, dyes, polymers, and other materials such as GaN, that luminesce. Phosphor particles may have an average diameter between 5 nm and 50 μm in some embodiments. Any suitable phosphor may be used, including but not limited to, garnet-based phosphors such as $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as $(Ca,Sr)AlSiN_3$:Eu and $(Ca,Sr,Ba)_2Si_5N_8$:Eu.

As used herein, the term "filler" refers to materials that may, for example be disposed in the space between a light emitting element and the upper surface of the device, e.g., within an organosiloxane binder. Fillers include, but are not limited to, silicon dioxide particles, alumina particles or titanium dioxide particles, e.g., in the size of approximately 3 nm to 50 microns. Some "filler" materials may be used as light scattering elements that create a more uniform light distribution.

As used herein the term "optical modifier" refers to wavelength converting materials that emit colors of light may that are added to light emitting devices (e.g., LEDs) to tailor the spectrum of light emitted from the device. As used herein, therefore optical modifiers include phosphor particles, organic semiconductors, II-VI or III-V semiconductors, II-VI or III-V semiconductor quantum dots or nanocrystals, dyes, polymers, or materials such as GaN that luminesce. Phosphor particles may have an average diameter between 5 nm and 50 μm in some embodiments. Illustrative, non-limiting examples of phosphors include garnet-based phosphors such as $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as $(Ca,Sr)AlSiN_3$:Eu and $(Ca,Sr,Ba)_2Si_5N_8$:Eu.

As used herein the term "condensation cure catalyst" refers to any catalyst known to be useful for facilitating crosslinking and/or chain extension in organosiloxane polymer compositions; e.g., a material that promote ring opening and/or the reaction between hydrolysable groups (e.g., alkoxy groups) substituted on silicon and hydroxyl groups substituted on silicon. Illustrative condensation catalysts include those incorporating tin, lead, antimony, iron, cadmium, barium, manganese, zinc, chromium, cobalt, nickel, aluminium, gallium germanium, titanium and zirconium, acid and base reagents, as known in the art. Acid and base reagents are also known for catalyzing ring-opening polymerization of cyclic siloxane motifs.

As used herein, the term "film" may, in certain embodiments, refer to "free-standing" structures that are applied to LED's. In other embodiments and aspects of the disclosure, this term may refer to, and is meant to encompass, any relatively thin structure or part that is less than about 500 micron in thickness, which film may be prepared by (but not limited to) spray-coating, electrophoretic deposition, and the like.

Figure 2:
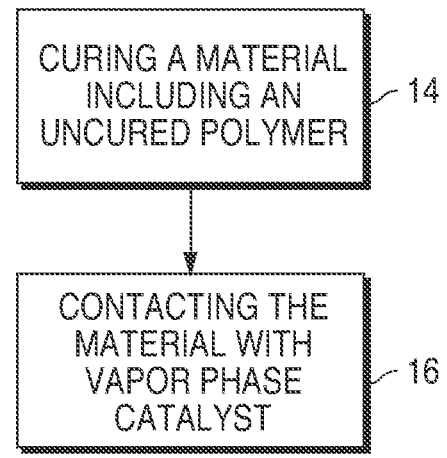

FIGS. 1 and 2 illustrate different methods using one or more vapor phase catalysts, according to embodiments of the invention. Each of the methods may be used, for example, on a film that is laminated or otherwise disposed over an LED, though any suitable use is contemplated within the scope of the invention. Some examples of specific materials used in the methods of FIGS. 1 and 2 are described in the examples below.

In the method of FIG. 1, in block 10, a material is contacted with a vapor phase catalyst. The material may be a film, as described above, or any other suitable material in any suitable form. The vapor phase catalyst may be a catalyst that causes or facilitates crosslinking (i.e., curing) of an uncured polymer in the material.

In block 12 of FIG. 1, after contacting the material with the vapor phase catalyst in block 10, the uncured polymer in the material is cured, by any suitable curing process appropriate to the uncured polymer.

In a first example of the embodiment of FIG. 1, the material includes an uncured polymer, a catalyst, and particles that inhibit the catalyst in the material. The catalyst in the material is often a different catalyst from the vapor phase catalyst, though in some embodiments the two catalysts may be the same material. The catalyst in the material is necessary, or merely beneficial, to curing the uncured polymer in the material. The catalyst in the material is inhibited or disabled by the particles in the material. The vapor phase catalyst may replenish or reactivate the catalyst in the material.

The particles that inhibit the catalyst in the material are often wavelength converting particles such as phosphor but may be any material. These particles are included for optical or reasons other than inhibiting the catalyst; in other words, inhibiting the catalyst is a negative side effect of the particles, not a reason for including the particles in the material.

In a second example of the embodiment of FIG. 1, the material includes an uncured polymer and particles such as wavelength converting or phosphor particles. Prior to the contacting in block 10, no catalyst is included in the material; any catalyst used for curing in block 12 is provided in block 10 by contacting the material with a vapor phase catalyst.

In some embodiments, during the contacting, the catalyst infuses into the film. The infused catalyst may partially or fully decompose or volatilize during cure or after cure, such that in some embodiments, the infused catalyst is not irreversibly incorporated into the film.

In the method of FIG. 2, in block 14, an uncured polymer in a material is cured, by any suitable curing process appropriate to the uncured polymer. The material may be a film, as described above, or any other suitable material in any suitable form. "Curing" may refer to a process that causes crosslinking and/or chain extension of the uncured polymer in the material.

In block 16 of FIG. 2, after curing the uncured polymer, the material is contacted with a vapor phase catalyst. The vapor phase catalyst in block 16 retards or stops curing of the uncured polymer. For example, the vapor phase catalyst in block 16 may retard or stop crosslinking of the polymer.

Suitable films for use with the method of FIGS. 1 and 2 may be formed by, for example, mixing an uncured polymer with any other materials in the film (catalyst and particles in example 1; particles only in example 2) and casting the mixture into a film; electrophoretically depositing the particles on a substrate and dispensing the uncured polymer over the deposited particles; and electrophoretically depositing the particles on a substrate and molding the uncured polymer over the deposited material.

Specific examples of the methods illustrated in FIGS. 1 and 2 are described below.

The present inventors have discovered and identified a number of problems that interfere with curing and cross-linking of organosiloxane resins, particularly in the context of preparation of a siloxane resin binder carrying one or more phosphors for use in developing LED based light emitting devices. In particular, the present inventors discovered that inclusion of phosphor particles—as well as optical or rheological additives including, but not limited to, $TiO_2$, $SiO_2$, $Al_2O_3$, $ZrO_2$, and BN particles—in those binders resulted in interference with the cure of those resins. Applicants believe without wishing to be held to that belief that this observed interference with curing could be the result of surface adsorption, or to the presence of additional "acid-base" chemical moieties, generated either by surface interactions or by reacting with the environment, that can lead to the introduction of excess hydroxyls (silanols) by hydrolysis of moieties sensitive to (hydrolysable by) acid or base, which will interfere with cure. The interference resulted in accelerated cure for some phosphor systems, and cure inhibition for others, making it extremely difficult to achieve established standard fabrication processes.

The present inventors have also discovered that, in certain formulations, the presence of fillers will accelerate the rate of curing of organosiloxane resins, leading to a reduction in the shelf lifetime of uncured films the creation of a need for shipping and storing those uncured films at low temperatures (e.g. <−10° C.). Such cure acceleration may also result in an undesirable continuous crosslinking during device operation, resulting in embrittlement and eventual failure.

In contrast, the presence of materials that inhibit the curing of organosiloxane resins will also interfere with the manufacturing process it may require that curing and processing B-staging times to be extended beyond practical operation windows. In addition, cure inhibition may result in device failure by not achieving sufficient modulus, i.e. resin crosslinking that provides rigidity to the resinous materials, allowing deformation or flowing of the resin under operation conditions.

The inventors have also discovered that traces of catalyst remaining in the film may react in the presence of light and heat with extrinsic organic moieties, volatile organic compounds (VOC's) and other organic contaminants, yielding transient and/or permanent browning and/or embrittlement of the encapsulants and the device into which they are incorporated.

More specifically, the present inventors have noted that, with certain materials, e.g. resin linear organosiloxane block copolymers (RLOBC), cross-linking and thermal curing (e.g., thermal curing) were strongly inhibited by the presence of certain phosphors, nitride phosphors, fumed $SiO_2$ (e.g., Cab-O-Sil® M5 Cabot Corporation, Billerica Mass.), Titanium Oxide, certain YAGs (yttrium aluminum garnet crystalline materials), particularly those with a relatively small particle size distribution, and yet were strongly accelerated by other constituents of the formulation(s).

In other instances, however, with certain other materials, e.g. other resin linear organosiloxane block copolymers, and even other batches of the same materials, cross-linking and thermal curing (e.g., thermal curing) were strongly inhibited by nitride phosphors but not by $SiO_2$ particles.

The inventors have further discovered that materials that inhibit cross-linking and curing, as noted above, may have the beneficial effect of slowing the rate of embrittlement, apparently as a result of their ability to inhibit residual cross-linking reactions that can still take place in the cured materials.

In order to solve these problems and obviate some or all of the deleterious effects noted above, the present inventors have discovered a method for the rapid cure of siloxane resins, including organosiloxane resins and RLOBC materials, using gas-phase catalysis. The presently-disclosed methods provide a number of advantages arising from the use of vapor-phase catalysis over conventional catalysts, including but not limited to: (1) curing can be achieved in significantly shorter time, e.g., in some instances in minutes rather than hours; (2) curing can be achieved at a lower temperature, e.g., in some instances at about 50° C. rather than at about 150° C.; and (3) catalyst concentration and composition in the resin can be controlled externally, i.e., it is not fixed by the resin formulation. Accordingly, since catalyst activity is controlled by its concentration, vapor phase catalyst dispensing can be followed by vacuum removal of the catalyst, enabling rapid initial cure followed by inactivation after cure. Inactivation after cure, e.g., by vacuum removal of the vapor-phase catalyst(s) leads to improved thermo-mechanical stability of the cured resin, thereby improving device reliability. The methods disclosed herein also overcome the catalyst-inhibiting effects of phosphors and slurry additives, such as $TiO_2$, silica, zirconia, boron nitride, and alumina particles. In the alternative the proper use of a vapor-phase catalyst capable of neutralizing or blocking a previously present catalyst inhibits or retards the post-curing process of a completely cured polymer, thus preventing embrittlement and device failure during use.

The present disclosure provides a method for preparing, inter alia, a phosphor binder (an organo-siloxane resin, e.g., a RLOBC) that is subjected to a rapid curing process using vapor (gas) phase catalysts whereby the curing process is completed in significantly shorter time (e.g., in minutes rather than hours), and at lower temperature (e.g., 50° C. rather than 150° C.). The use of a lower curing temperature provides an added benefit in that the fabrication process becomes compatible with other low-temperature processes, including but not limited to those used in the manufacture of printed, wearable, and organic-based electronics (e.g., OLEDS, textiles etc.)

The methods disclosed herein allow the catalyst concentration and the composition of the resin to be formulated can be controlled separately and independently from one another and not fixed by the formulation. Since the present methods disclose separately applied vapor phase catalysts, they enable preparation of films (e.g., siloxane polymers, organosiloxane polymers, organo-siloxane resins, resin-linear organosiloxane block copolymers and the like) that are more stable during storage before contact with the vapor phase catalysts at a desired time for additional crosslinking and curing. The materials and methods disclosed herein can be operative irrespective of phosphor systems, additives, fillers, wavelength modifiers, and the like (e.g., $TiO_x$, $SiO_2$, $Al_2O$, BN, $ZrO_2$ and the like). The vapor phase catalysts are removable from the systems described or they can be neutralized after cure, and they also have the ability to alter preparation of the material by adding, e.g., organic amines, aminopropyl silanes. Furthermore, the use of vapor phase materials permit deactivation of the polymerization reaction after cure leading, thereby providing resins with thermo-mechanical stability, as well as improving the reliability of devices incorporating those resins.

The materials and methods disclosed herein are applicable to any use of siloxane polymers that are to be cured, thermally cured, or cross-linked for essentially any application or purpose. These include, for example, particularly those employing siloxane polymers (including but not limited to organosiloxane polymers, RLOBCs, and the like), that include condensation catalysts as residual components of the manufacturing process by which they are prepared, and/or that comprise other chemical components, including but not limited to, phosphors, additives, fillers, and wavelength modifiers that may inhibit or accelerate or otherwise interfere with subsequent cross-linking, curing, B-staging of those polymers, or that may limit the storage life of the uncured or the cured polymers.

The materials to be treated according to the methods disclosed herein include the uncured organosiloxane polymer provided in the form of a composition, a composition that may further comprise, for example, one or more phosphor, fillers, optical modifiers, rheology modifiers, or combinations thereof.

Generally, the material to be treated and ultimately cured further comprises one or more additional components, including but not limited to, phosphors, additives, fillers, wavelength modifiers, rheology modifying agents and the like, which components may affect the rate and extent of curing of the material, particularly in the absence of exposure to the vapor phase catalysts of the present disclosure.

The material contacted with the vapor phase catalyst is referred to herein as a "treated material," or an "uncured treated material," e.g. a treated or uncured treated organosiloxane polymer or a treated RLOBC. As demonstrated in the Examples below, after exposure to the vapor-phase catalysts, including those specifically described herein, curing of the so-treated material proceeds more rapidly and to a greater extent as compared to the curing of materials not exposed to the vapor phase catalysts. For example, exposure of composite films based on RLOBC binder, e.g., those comprising nitride phosphors and designated "warm white" (2700 K) films and "cool white" (5700 K) films, to the vapor phase catalysts described herein provides treated, uncured materials that can be cured to provide more highly cross-linked cured materials in much shorter times as compared to controls as depicted in Table I and FIG. 3, FIG. 4, and FIG. 5.

In certain embodiments, the vapor phase catalyst comprises an organic or silane amine such as, but not to be limited to DBU, Bis-DMADES, or APTMS. In other embodiments, the methods of the present disclosure include contacting of the uncured or partially-cured material with a suitable vapor phase catalyst as well as exposure to an appropriate plasma, such as but not limited to, a radio-frequency generated $N_2$ plasma. In one aspect of this embodiment the material to be treated is exposed sequentially, first to the suitable vapor phase catalyst and then, in a subsequent step, the vapor phase catalyst treated material is exposed to an appropriate plasma.

In another embodiment, the methods described herein further include the step of removing the vapor phase catalyst by any suitable technique such as, for example, by exposure to a vacuum.

In another embodiment, the present disclosure provides a method for making a light emitting device that comprises providing a LED disposed on a surface, applying a composition comprising an uncured or partially-cured organosiloxane polymer to an emission surface of said LED, e.g., by lamination or other suitable process, and contacting the uncured or partially-cured organosiloxane polymer with a vapor phase catalyst of the invention under conditions sufficient to provide an uncured treated polymer. The uncured treated polymer can then be cured, e.g., thermally cured at a temperature and for a time sufficient to provide a cured organosiloxane polymer. In certain aspects of this embodiment, the curing occurs at a lower temperature and/or in a shorter time as compared to a control process not including said contacting step. In other certain aspects of this embodiment, the vapor phase catalyst is or comprises an organic amine, which can be, in non-limiting examples, DBU, Bis-DMADES or APTMS. In other aspects of this embodiment, the uncured organosiloxane polymer is a linear organosilane polymer, a cyclic organosiloxane polymer, a branched organosiloxane polymer, an organosiloxane resin, a RLOBC, or a combination of two or more thereof, while in one specific aspect, the uncured organosiloxane polymer is in the form of a film.

In other aspects of this embodiment, the uncured or partially-cured material is also contacted with a suitable plasma that in one non-limiting example, is a radio-frequency generated N$_2$ plasma, which may be applied, e.g., after exposure to the vapor phase catalyst.

In other aspects of this embodiment, the plasma may be an oxygen or argon plasma, the power of the plasma may be pulsated, and the pulses may be alternated injection of ammonia or aminopropyl silane vapors.

In another embodiment, the present disclosure provides a lighting device prepared by the methods disclosed herein, including but not limited to, a lighting device incorporating an LED as described above that has been contacted with an uncured or partially-cured material subsequently exposed to a vapor phase catalyst of the present disclosure.

In a still further embodiment, the present disclosure also provides a method for inhibiting organosiloxane polymer curing, a method that comprises contacting an uncured (or a partially-cured) organosiloxane polymer with a vapor phase inhibitor under conditions sufficient to provide an uncured treated polymer, and then curing the treated polymer at a temperature and for a time sufficient to provide a cured organosiloxane polymer. According to this method, the curing occurs at a higher temperature, and/or in a longer time, and/or to a lesser extent as compared to a control process not including said contacting step. The inhibitor can also be used to neutralize or quench the crosslinking effect of curing catalysts during operation (aging). In one aspect of this embodiment, the vapor phase inhibitor or plasticizer is pyridine or acetoxyethyl trimethoxysilane.

The present disclosure further provides materials and methods permitting low temperature cross-linking and curing of organosiloxane polymers, e.g., resin linear organosiloxane block copolymers. These methods allow curing at temperatures of approximately 50° C., and are adaptable to permit "RTV" (room temperature vulcanization) curing of organosiloxane polymers.

As noted above, the present disclosure provides materials and methods for efficient, better controlled, and more predictable curing of siloxane polymers, e.g., of resin linear organosiloxane block copolymers useful in the manufacture of LED devices. However, the present disclosure is more generally applicable to the broad class of encapsulation technologies and applications, providing low emission of corrosive byproducts (e.g., acetic acid), as well as crosslinked and cured materials (and devices incorporating those materials) with improved thermo-mechanical properties.

In addition to the above, embodiments of the invention include vapor phase materials and methods that can be used to inhibit or suppress the rate and extent of cross-linking and curing of organosiloxane polymers, including RLOBC. These include, for example, AETMS and relatively weak organic bases such as pyridine. These materials can have either a strong plasticizing effect or a more moderate effect on the rate and extent of cross-linking and curing. These inhibitory materials and methods can be used, alone or in combination with, the catalytic materials and methods disclosed, to provide approaches allowing modulation and more precise control of the rate and extent of cross-linking and curing of the subject materials as well as the service life of devices into which they may be incorporated.

As described above and as demonstrated below, the present inventors have discovered a process that addresses the problems created by components that accelerate or inhibit curing of inter alia, phosphor containing materials. This process comprises the use of catalysts that (1) are inactive during film storage, (2) can be activated at desired times, (3) operate irrespective of phosphor systems and additives (TiO$_x$, SiO$_2$, Al$_2$O$_3$ and the like), and (4) can be removed away from the system and neutralized after cure.

Having generally provided the above disclosure, a further understanding can be obtained by reference to certain specific examples, which are provided herein for purposes of illustration only, and are not intended to be limiting unless otherwise specified.

EXAMPLES

The studies described herein were conducted using RLOBCs obtained from Dow Corning (Midland, Mich.). Such materials can be prepared according to the materials and methods disclosed in U.S. Patent Application Publication No. 2013/0171354 A1, U.S. Patent Application Publication No. 2013/0168727 A1, U.S. Patent Application Publication No. 2013/0231438 A1, and U.S. Patent Application Publication No. 2013/0245187 A1, each of which is incorporated herein by reference in its entirety.

Pre-treatment (i.e. treatment prior to curing) of the target RLOBC films was carried out using an Integrated Surface Technologies (Menlo Park Calif.) system device. In one example of a vapor catalyst infusion experiment, one or more siloxane films (for example, 60 μm in thickness, and 100 mm×100 mm lateral dimensions) were introduced in the main chamber (preheated to 50° C.). After a N$_2$ purge followed by vacuum cycle, the desired catalytic vapor was allowed to enter the chamber until a desire pressure was achieved (for example, 0.5 mm Hg). The chamber was then sealed for a desired amount of time (for example, 15 minutes). Afterwards the chamber was evacuated to remove unreacted vapors, and purged with nitrogen. The infused films were removed from the chamber for further processing. In other cases, before removing the films, an additional exposure to 200 Watt RF-generated N$_2$ plasma, was carried out at pressure of 250 mTorr for the time and at the temperature indicated below.

Unless indicated otherwise in the individual experiments below, curing and rheological characterization were carried out at a temperature of 150° C. Curing was monitored by measuring and plotting the viscoelastic response of the films as function of time while the films were subjected to a curing profile as described below. The plots described below exhibit the values for viscoelastic shear modulus G' (in units of Pa) (FIG. 3A-FIG. 7A), and tan delta=G"/G' (G" is the viscoelastic "loss modulus") (FIG. 3B-FIG. 7B). Both G' and tan delta are dependent variables that change both with time as well as with temperature. In the initial stage the temperature is ramped from about 50° C. to 150° C. at the rate of 5° C./min (between 250 seconds to 500 seconds, depending on the initial temperature), and when it reaches 150° C., it is held constant for the duration of the measurement. In the experiments described below, a rheometer is used to measure the stress (in Pa) associated with oscillating a 25 mm diameter aluminum circular plate in contact with an 800 micron thick film cut in the shape of a 25 mm disk, with a frequency of 1 Hz, and a strain of 1%

As indicated below and in the Figures, during the initial temperature ramp, G' typically decreases and tan delta increases (i.e. the film becomes softer), but when the temperature is held constant at 150° C., G' typically increases and tan delta decreases as a result of the ongoing and continuing crosslinking (curing) process. In other words, a higher value of G' and/or a lower value of tan delta indicate more crosslinking. The time when the samples reach 150° C. is easily identified in each of the plots in the Figures, because both tan delta and G' typically exhibit a sharp change in slope at that point.

As noted above curing of RLOBC polymer systems can be inhibited by the presence of additives including those incorporated during manufacture of phosphor systems including, e.g., "warm white" 2700 K films comprising nitride phosphors and "cool white" 5700 K films. The experiments below demonstrate that exposure of such untreated films to the vapor phase catalytic materials and systems of the present disclosure provides treated polymeric materials that cure more rapidly and thoroughly than untreated, control materials. These experiments also demonstrated that the rate and extent of cross-linking and curing may also be inhibited (where necessary or desired) by contacting uncured films with inhibitory or plasticizing vapor phase materials and processes.

Example 1: Catalytic Curing of a Clear RLOBC Film

In this experiment, rheology (elastic shear modulus G' and tan delta changes) were used to evaluate crosslinking before and after exposure to vapor phase materials, since elastic moduli E' and G' of elastomers are directly proportional to the crosslinking density (number of crosslink points per volume). In this, and the following experiments, G' and tan ($\delta$) were measured at elevated temperatures (150° C.) since that also allowed simultaneous evaluation of the curing kinetics. In this experiment, a RLOBC obtained from Dow Corning (Midland, Mich.) was prepared as a clear film, i.e. without phosphor. The vapor deposition system used for examples 1 and 2 was an IST system model RGM-210.

Figure 3A:
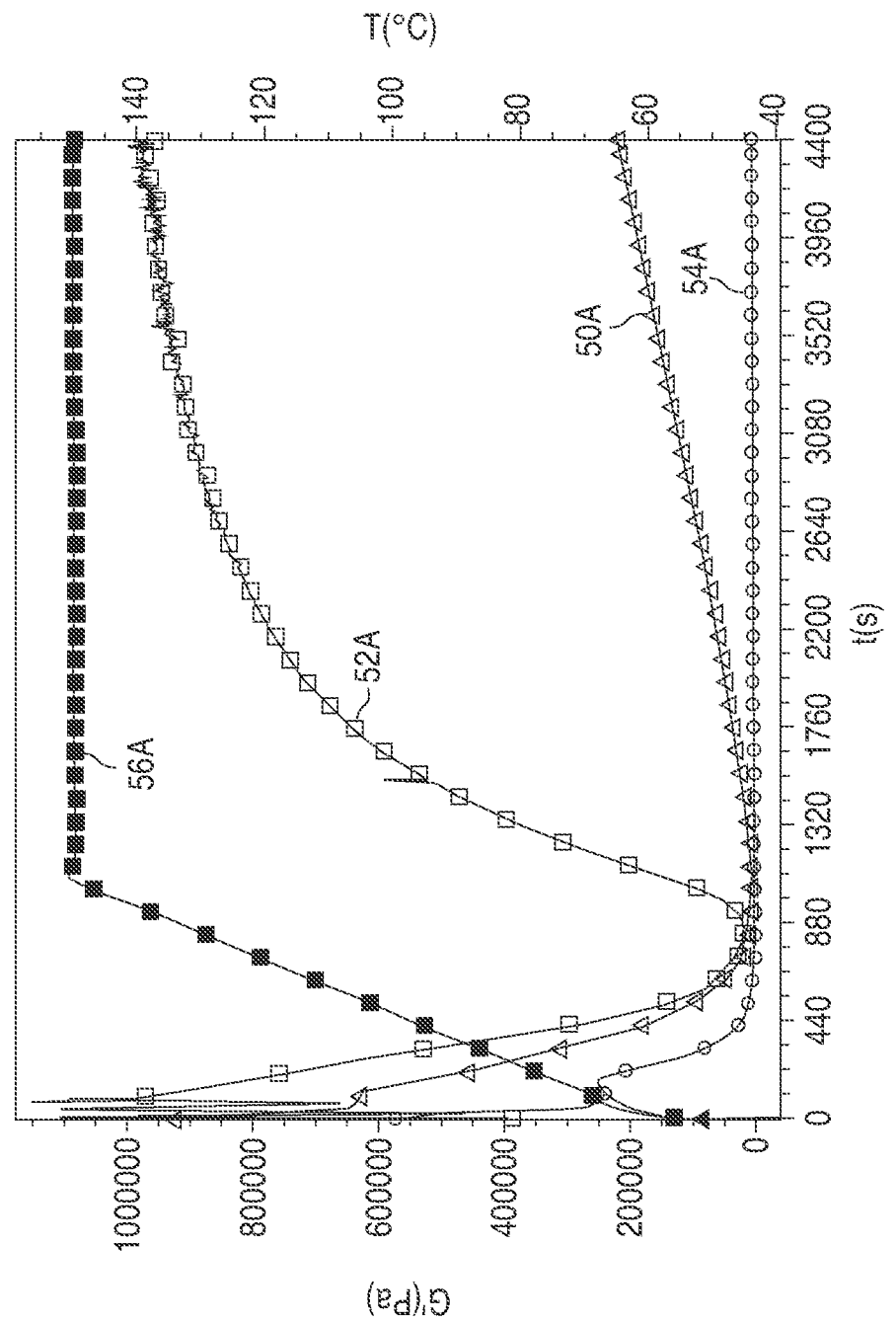
FIG. 3A illustrates shear modulus as a function of time for clear films that are untreated and treated with different vapor phase catalysts.
Figure 3B:
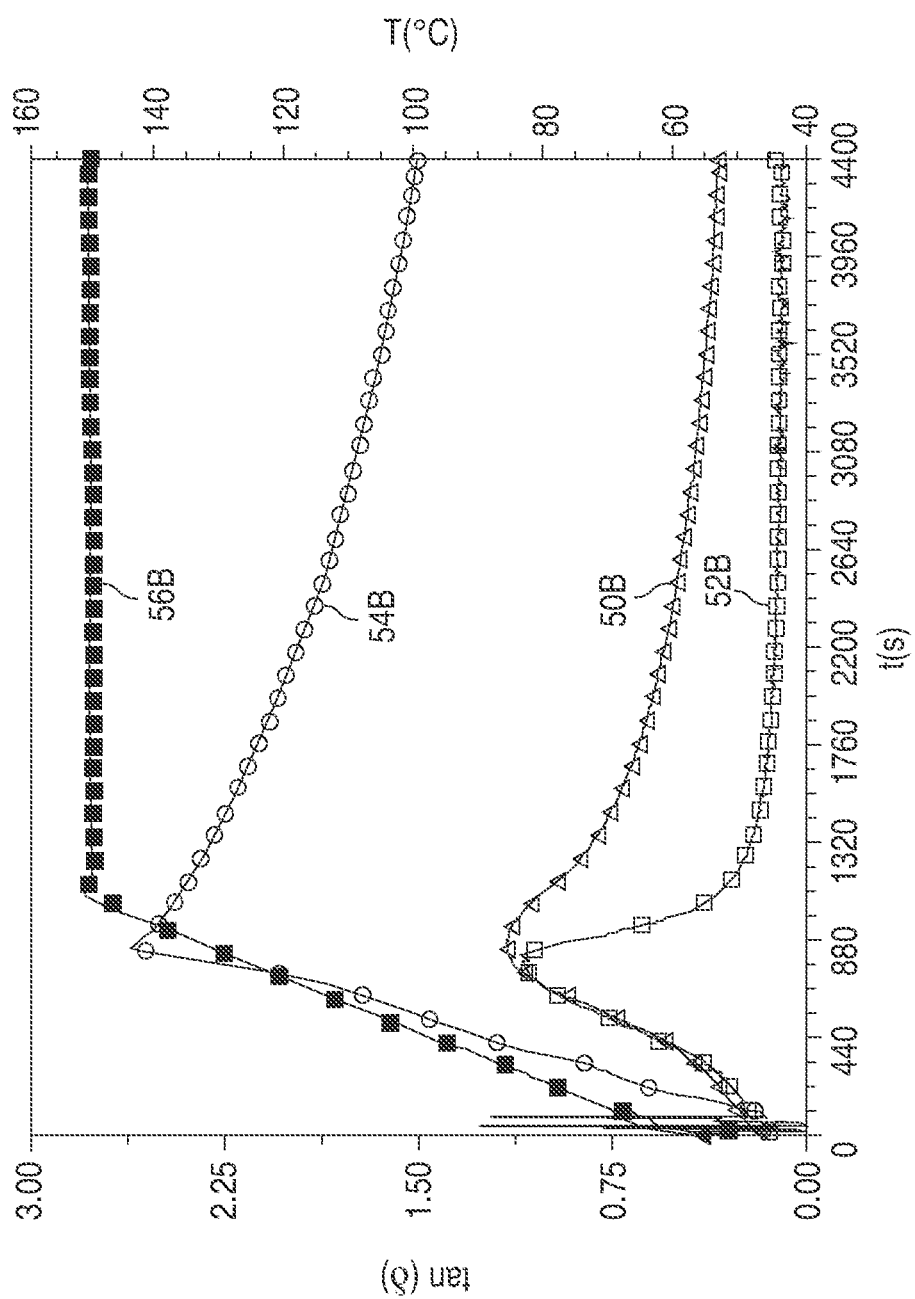
FIG. 3B illustrates tan delta as a function of time for clear films that are untreated and treated with different vapor phase catalysts.

As demonstrated in FIG. 3A and FIG. 3B, exposure of the clear RLOBC film to vapor phase catalysts Bis(dimethylamino)diethylsilane (BisDMADES) and 1,8-Diazabicyclo[5.4.0]undec-7-ene (DBU) markedly increased the observed rate of curing (cross-linking) as measured by G' increase and tan ($\delta$) decrease. More specifically, FIG. 3A and FIG. 3B depict the data obtained in a comparison between curing of an untreated RLOBC film (curve 54A on FIG. 3A, curve 54B on FIG. 3B, open circles), as compared to the same film exposed to vapor phase BisDMADES (curve 50A on FIG. 3A, curve 50B on FIG. 3B, open triangles), and as compared to the same film exposed to vapor phase DBU (curve 52A on FIG. 3A, curve 52B on FIG. 3B, open squares). The temperature is illustrated by curve 56A on FIG. 3A, curve 56B on FIG. 3B, closed squares. The untreated film showed a low modulus and large tan delta within one hour after reaching at 150° C. (G' ~0 KPa, tan ($\delta$)=1.6), indicating little cross-linking. By contrast, the films exposed to BisDMADES and DBU showed a much higher modulus and small tan delta, indicating much more crosslinking. In particular, after one hour at 150° C., the BisDMADES-treated film showed a modulus G' of 200 KPA and a tan delta of 0.4. At 150° C., the DBU-treated film showed a modulus G' of 900 KPA and a tan delta of 0.2.

Example 2: Catalytic Curing of a RLOBC Film Containing a Nitride Phosphor

Figure 4A:
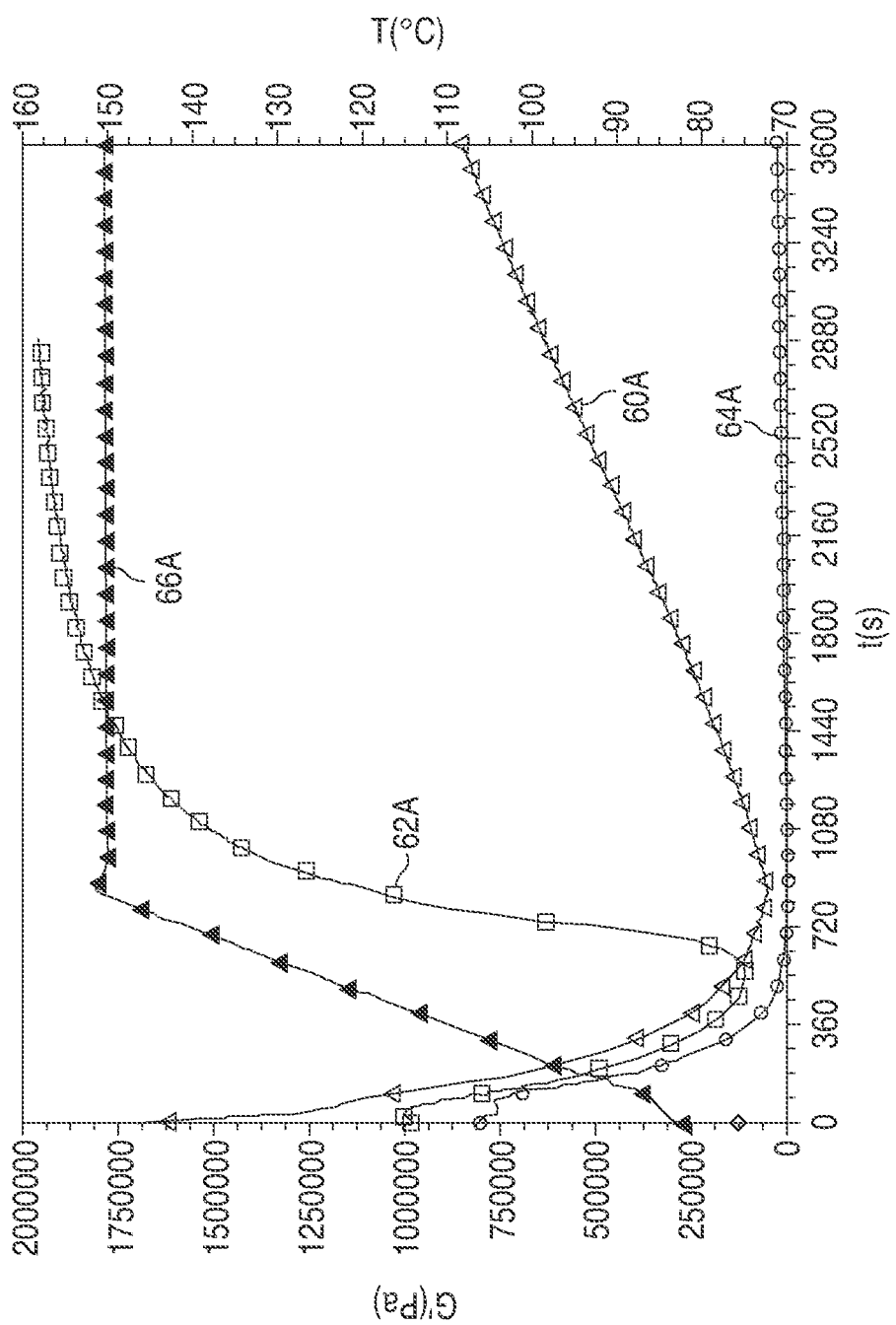
FIG. 4A illustrates shear modulus as a function of time for nitride phosphor-containing films that are untreated and treated with different vapor phase catalysts.
Figure 4B:
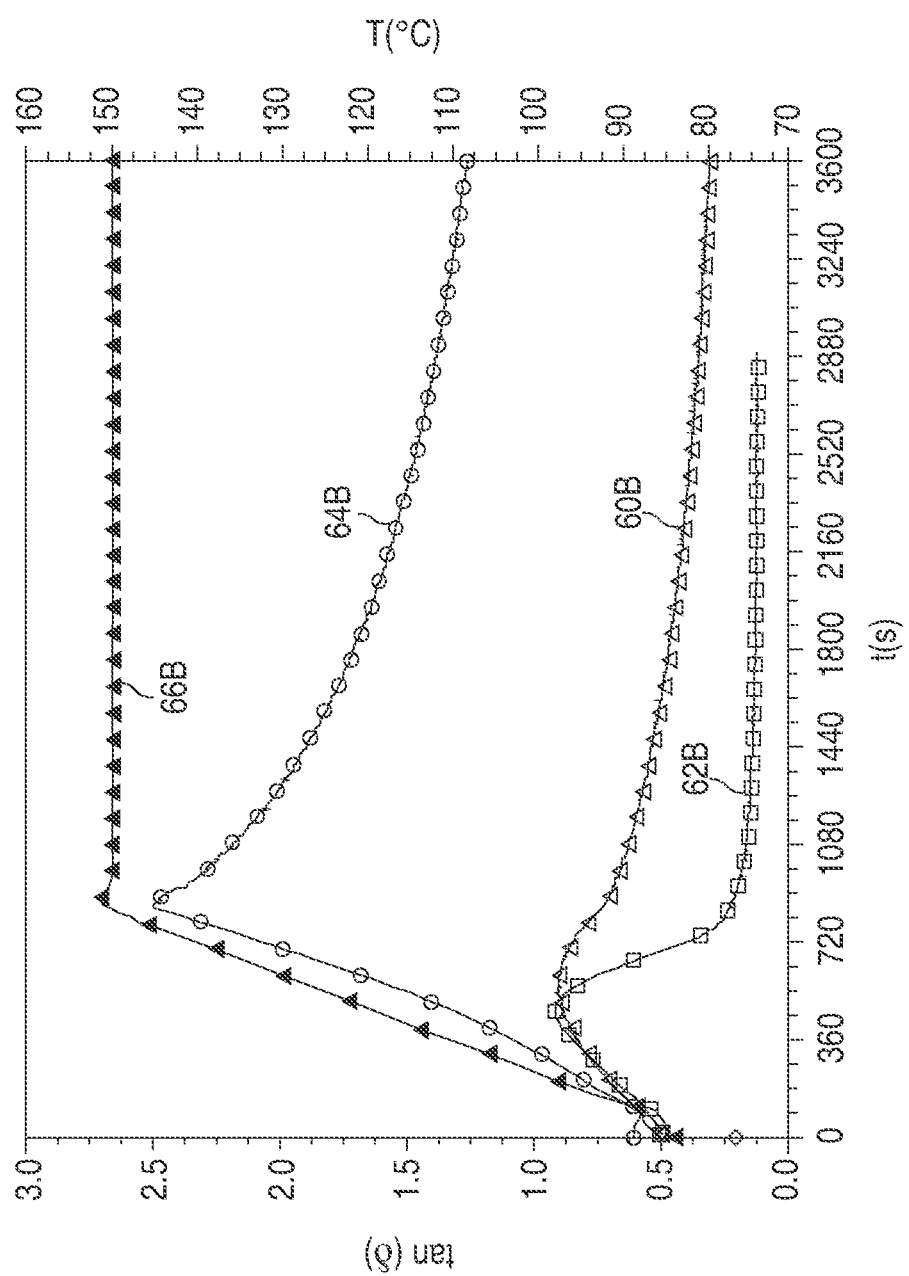
FIG. 4B illustrates tan delta as a function of time for nitride phosphor-containing films that are untreated and treated with different vapor phase catalysts.

In FIG. 4A and FIG. 4B, G' and tan-delta were measured at elevated temperatures (150° C.). In this experiment, a RLOBC obtained from Dow Corning (Midland, Mich.) was prepared with a nitride phosphor.

As demonstrated in FIG. 4A and FIG. 4B, exposure of the phosphor-containing RLOBC film to vapor phase catalysts Bis(dimethylamino)diethylsilane (BisDMADES) and 1,8-Diazabicyclo[5.4.0]undec-7-ene (DBU) markedly increased the observed rate of curing (cross-linking) as measured by G' increase and tan ($\delta$) decrease.

More specifically, FIG. 4A and FIG. 4B depict the data obtained in a comparison between curing of an untreated RLOBC nitride phosphor-containing film (curve 64A in FIG. 4A, curve 64B in FIG. 4B, open circles), as compared to the same film exposed to vapor phase BisDMADES (curve 60A in FIG. 4A, curve 60B in FIG. 4B, open triangles), and as compared to the same film exposed to vapor phase DBU (curve 62A in FIG. 4A, curve 62B in FIG. 4B, open squares). The temperature is illustrated by curve 66A in FIG. 4A, curve 66B in FIG. 4B, closed squares. The untreated film showed a low modulus and large tan delta after one hour at 150° C. (G' ~0 KPa, tan ($\delta$)=1.4), indicating little crosslinking. By contrast, the films exposed to BisDMADES and DBU showed a much higher modulus and small tan delta, indicating much more crosslinking. In particular, after one hour at 150° C., the BisDMADES-treated film showed a modulus G' of 750 KPA and a tan delta of 0.4. At 150° C., the DBU-treated film showed a modulus G' of 1900 KPA and a tan delta of 0.2.

Example 3: Catalytic Curing of a RLOBC Containing a Nitride Phosphor

In this experiment, a RLOBC obtained from Dow Corning (Midland, Mich.) was prepared as a "warm white" 2700 K film comprising nitride phosphors. The vapor infusion system in examples 3 through 5 was an IST system RPX-540. The infused catalyst was APTMS, applied at ca. 100 mm Hg, and 50 C.

The inventors have observed that curing of this RLOBC (per se) to ~300 KPa typically requires approximately four hours at 150° C. However, it has also been observed by the inventors that curing of this film was highly inhibited by the presence of a Nitride phosphor; in fact, it was essentially non-curable by thermal process when the RLOBC was combined with that phosphor. As demonstrated in FIG. 5A and FIG. 5B and Table 1, exposure of the phosphor-containing RLOBC film to vapor phase APTMS markedly increased the observed rate of curing (cross-linking) as measured by G' increase and tan ($\delta$) decrease. (The temperature in FIGS. 5A and 5B is indicated by curves 26A and 26B, respectively.)

Figure 5A:
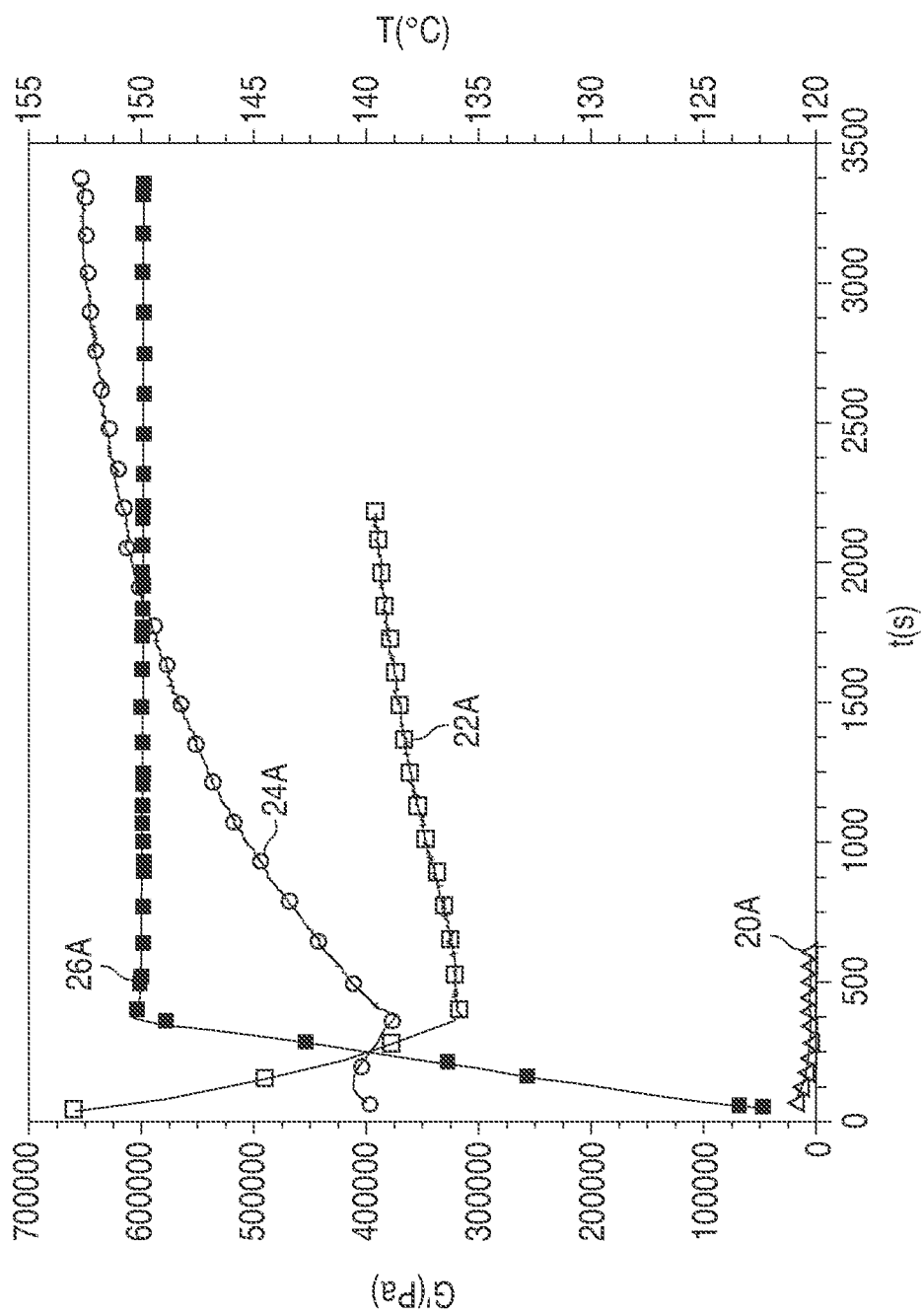
FIG. 5A depicts the effects of pre-treatment of an uncured, resin linear organosiloxane block copolymer (RLOBC) deposited as a film formulated with a phosphor mixture including a Nitride Phosphor for "warm white" emission (2700 K), on the rate of cure of that resin at 150° C. as a function of time (in seconds) as reflected by changes in the storage modulus (G') (left vertical (y) axis) in Pascal units. (Δ) symbols: untreated control; (□) symbols: pre-treatment with the vapor phase catalyst APTMS; (○) symbols: pre-treatment with both APTMS and an RF $N_2$ plasma.
Figure 5B:
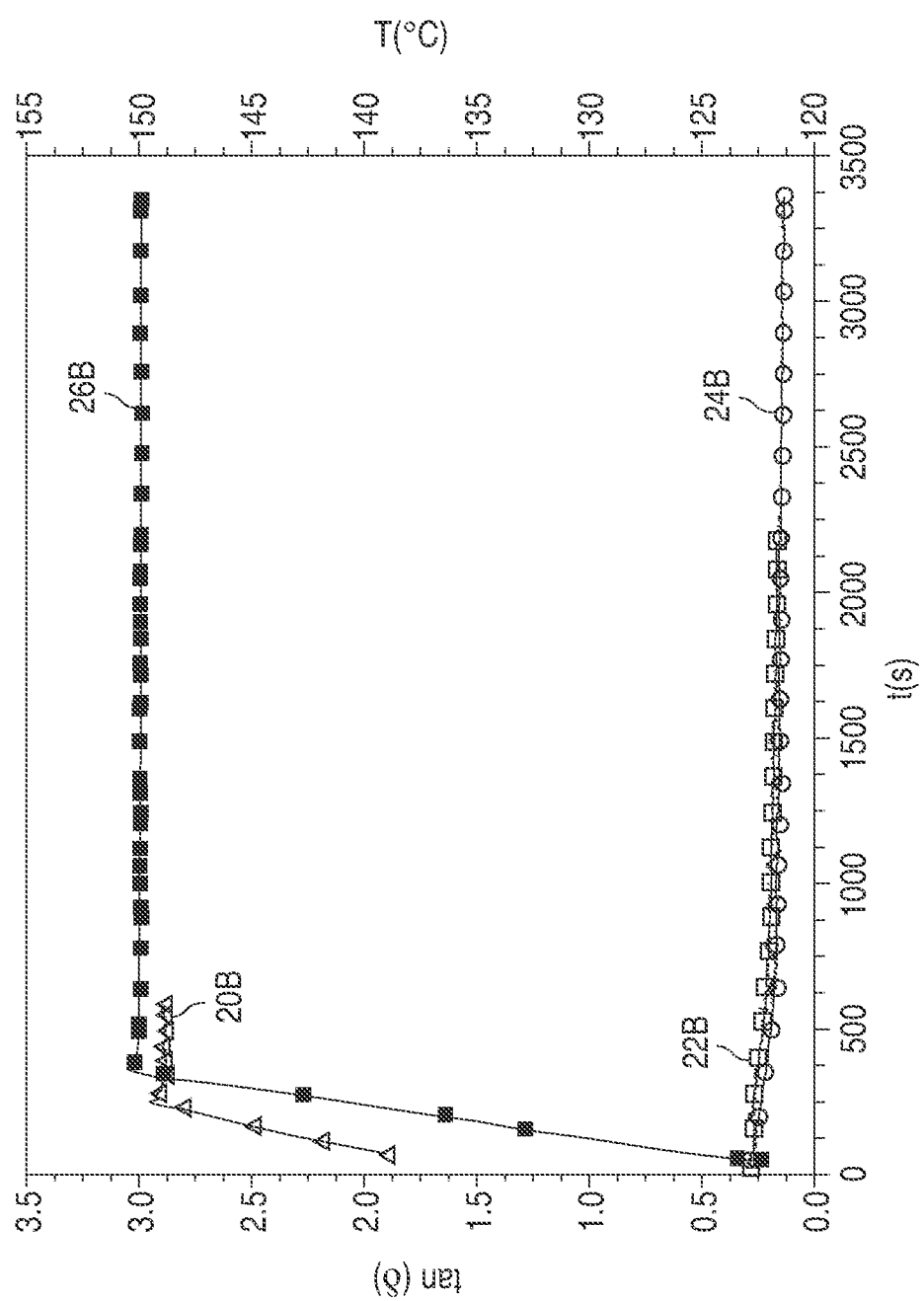
FIG. 5B depicts the effects of pre-treatment of an uncured RLOBC, deposited as a film formulated with a phosphor mixture including a Nitride Phosphor for "warm white" emission (2700 K), on the rate of cure of that resin at 150° C. as a function of time (in seconds) as reflected by changes in the tan (δ) values. (Δ) symbols: untreated control; (□) symbols: pre-treatment with the vapor phase catalyst APTMS; (○) symbols: pre-treatment with both APTMS and an RF $N_2$ plasma.

More specifically, FIG. 5A and FIG. 5B depict the data obtained in a comparison between curing of an untreated "warm white" 2700 K RLOBC film (curve 20A on FIG. 5A, curve 20B on FIG. 5B, $\Delta$ symbols), as compared to the same film pre-treated either by exposure to APTMS for 15 minutes, (curve 22A on FIG. 5A, curve 22B on FIG. 5B, □ symbols), and as compared to the same film pretreated (sequentially) with APTMS followed by exposure to an N$_2$ plasma (curve 24A on FIG. 5A, curve 24B on FIG. 5B, ○ symbols). The untreated film cured for ~6 min. at 150° C. showed a modulus G'=6.4 KPa and tan ($\delta$)=2.9. By contrast, the film first exposed for 15 minutes to APTMS at 50° C. exhibited, G'=330 KPa and tan (δ) of ~0.2 after ~6 minutes of curing at 150° C. This represents a dramatic increase in modulus resulting from a short exposure of APTMS at relatively low temperature.

As compared to the untreated control samples, films pre-treated by exposure to APTMS alone or APTMS and the $N_2$ plasma exhibit both very large values for G' and very low values for tan (δ) at the earliest thermal curing times. These data indicate these pre-treated films had been crosslinked, even before the thermal cure, by the exposure to APTMS alone or APTMS and the $N_2$ plasma.

The inventors believe, without limiting embodiments of the invention to a particular theory, that addition of a plasma step can remove amine groups from the film, thereby minimizing the presence of amines that could become sources of browning in LED's ultimately produced that include these cured resins. The inventors further believe, again without limiting embodiments of the invention to a particular theory, that this catalytic process not only allows more rapid curing, but also provides a material that will undergo little post-crosslinking during subsequent high-temperature operating life (HTOL) testing, a reliability test applied to integrated circuits (ICs) to determine their intrinsic reliability over time.

In contrast to the results noted above with the primary amine APTMS, use of different functional vapor phase trimethoxy silane reagent (AETMS), yielded results that were extraordinarily different. Instead of crosslinking, the material softened more than 100-fold upon curing after pre-treatment with AETMS. The results of pre-treatment with APTMS and AETMS (without and with additional $N_2$ plasma treatment) on subsequent curing are presented in table I:

materials, the subsequent thermal curing of the RLOBC can be accelerated or it can be inhibited. The goal, as noted above, was to provide materials and methods for reproducible and complete curing of RLOBC deposited films, overcoming inhibition by some phosphors, as well as preventing subsequent, continued curing that could lead to embrittlement and browning of the materials.

Example 4: Catalytic Curing of "Cool White" (5700 K) Film with APTMS

This experiment was intended to determine the effect of infusing the uncured material with a vapor-dispensed APTMS on curing of the RLOBC films formulated with cool white (5700 K) phosphors. Temperature is illustrated by curve 36A in FIG. 6A and curve 36B in FIG. 6B.

Figure 6A:
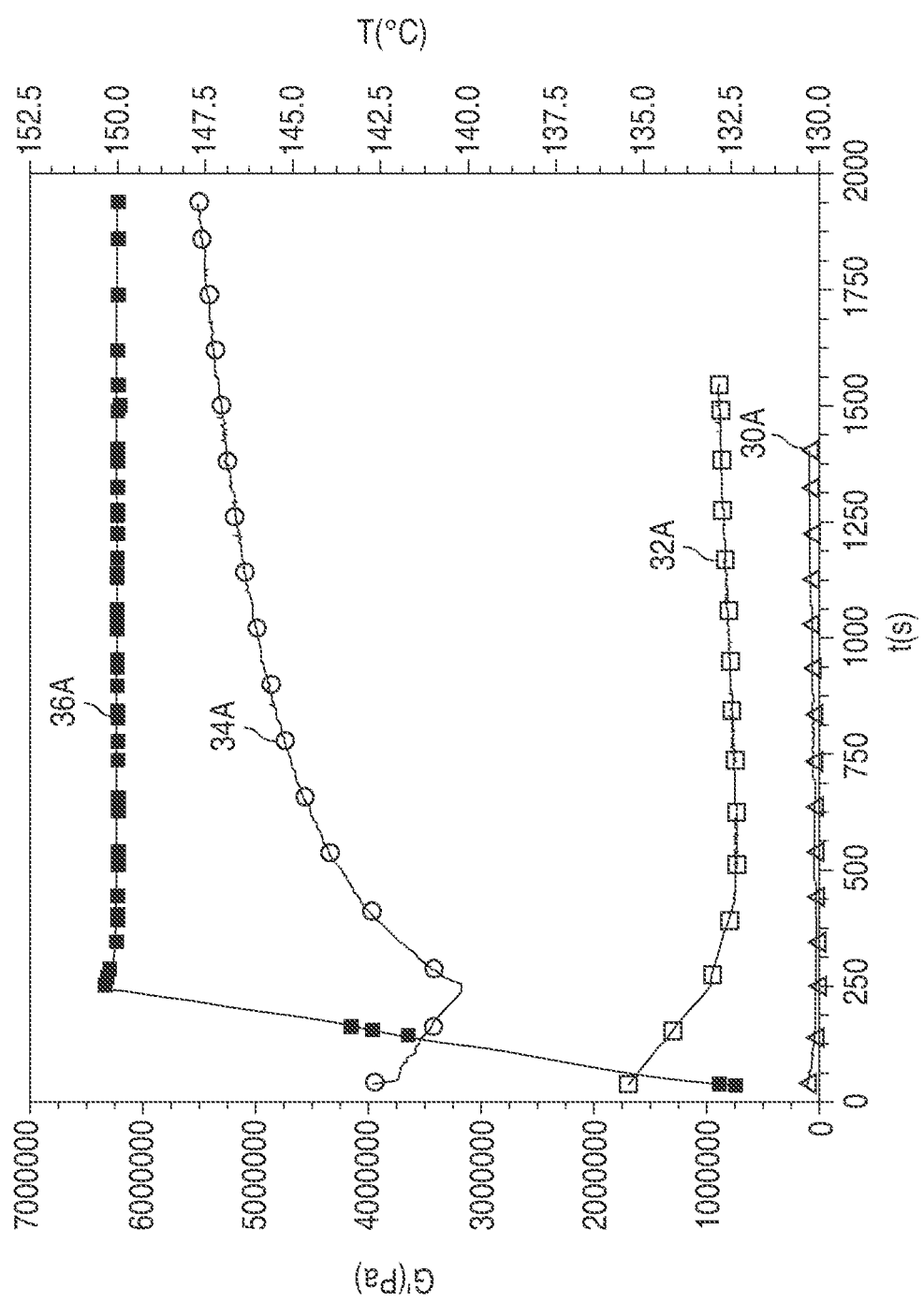
FIG. 6A depicts the effects of pre-treatment of an uncured, RLOBC deposited as a film formulated with a phosphor mixture including a Nitride Phosphor for "cool white" emission (5700 K), on the rate of cure of that resin at 150° C. as a function of time (in seconds) as reflected by changes in the storage modulus (G') (left vertical (y) axis) in Pascal units. (Δ) symbols: untreated control; (□) symbols: pre-treatment with the vapor phase catalyst APTMS; (○) symbols: pre-treatment with both APTMS and an RF $N_2$ plasma.
Figure 6B:
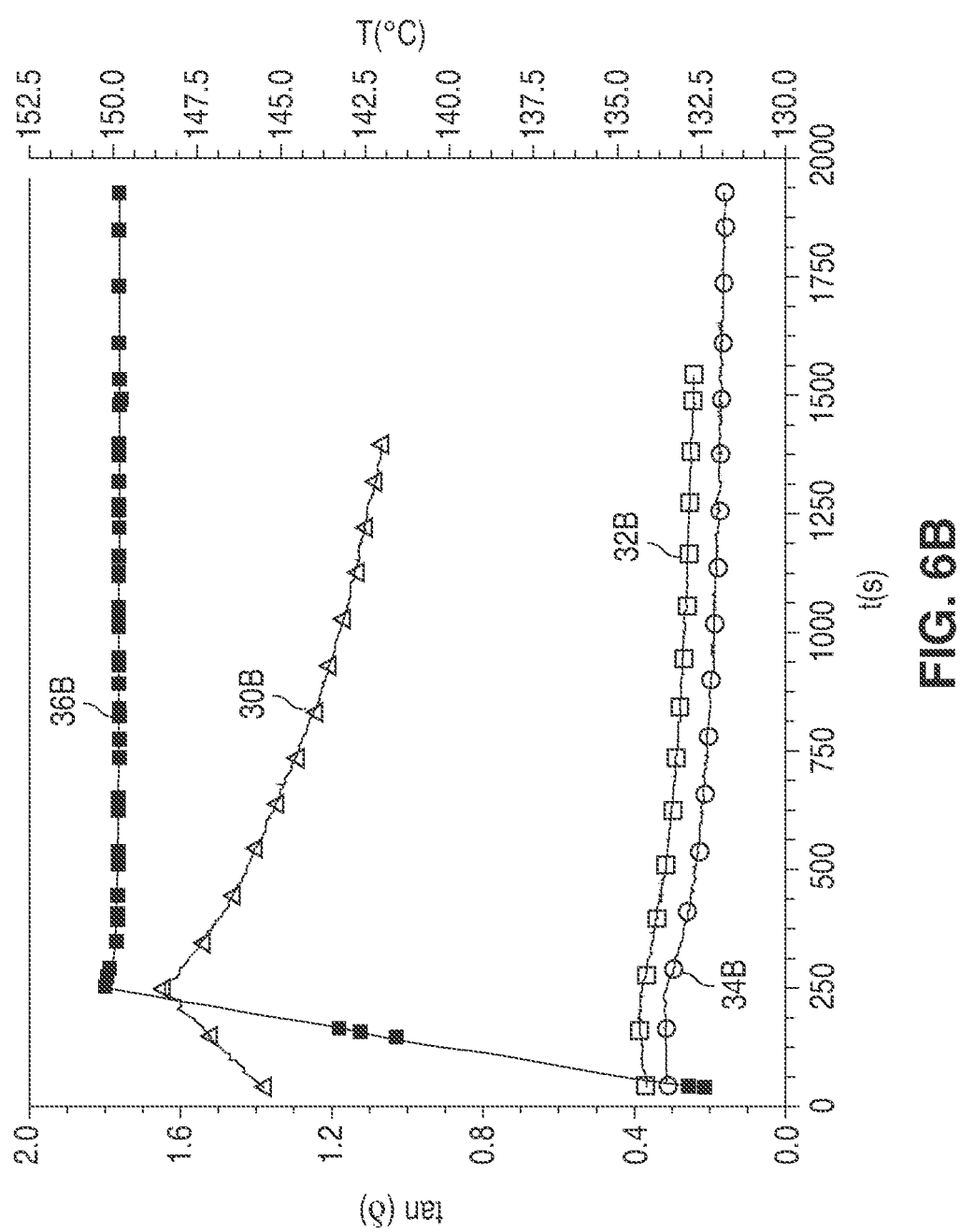
FIG. 6B depicts the effects of pre-treatment of an uncured RLOBC, deposited as a film formulated with a phosphor mixture including a Nitride Phosphor for "cool white" emission (5700 K), on the rate of cure of that resin at 150° C. as a function of time (in seconds) as reflected by changes in the tan (δ) values. (Δ) symbols: untreated control; (□) symbols: pre-treatment with the vapor phase catalyst APTMS; (○) symbols: pre-treatment with both APTMS and an RF $N_2$ plasma.

The indicated material (RLOBC film formulated with cool white (5700K) phosphor) was prepared as a film and exposed to an APTMS vapor for 15 minutes at 50° C. twice (curve 32A in FIG. 6A, curve 32B in FIG. 6B, □ symbols), or pre-treatment of the uncured film with APTMS for fifteen minutes at 50° C. followed by a 90 second exposure to a 200 W, 250 mTorr $N_2$ radio frequency generated plasma (curve 34A in FIG. 6A, curve 34B in FIG. 6B, ○ symbols). The control film was not subjected to treatment with vapor phase APTMS or the $N_2$ plasma (curve 30A in FIG. 6A, curve 30B in FIG. 6B, Δ symbols).

Table II shows the G' and tan (δ) of the films at selected points along the curing profile.

TABLE I

Curing Profiles of Warm White Film 2700K

| Pre-treatment | Peak Values At 150° C. | After 10 Min. At 150° C. | After 20 Min. At 150° C. | After 30 Min. At 150° C. | Observations |
|---|---|---|---|---|---|
| None | G' = 5.4 KPa<br>Tan (δ) = 3.0 | G' = 5.4 KPa<br>Tan (δ) = 3.0 | NA | NA | |
| 15 Min. APTMS | G' = 300 KPa<br>Tan (δ) = 0.27 | G' = 424 KPa<br>Tan (δ) = 0.23 | G' = 471 KPa<br>Tan (δ) = 0.21 | G' = 493 KPa<br>Tan (δ) = 0.20 | Stiff room temperature film |
| 15 Min. APTMS + 90 Sec. $N_2$ Plasma | G' = 1.13 MPa<br>Tan (δ) = 0.19 | G' = 1.5 MPa<br>Tan (δ) = 0.15 | G' = 1.63 MPa<br>Tan (δ) = 0.14 | G' = 1.69 MPa<br>Tan (δ) = 0.13 | Stiff room temperature film |
| 15 Min. AETMS | G' = 0.079 KPa<br>Tan (δ) = 5.7 | G' = 0.123 KPa<br>Tan (δ) = 4.22 | G' = 0.150 KPa<br>Tan (δ) = 3.9 | | Very tacky and soft |
| 15 Min. AETMS + 90 Sec. $N_2$ Plasma | G' = 0.048 KPa<br>Tan (δ) = 7.5 | G' = 0.080 KPa<br>Tan (δ) = 5.8 | NA | NA | Very tacky and soft |

APTMS = aminopropyl trimethoxysilane
AETMS = acetoxyethyl trimethoxysilane

These data demonstrate that the phosphor-mediated curing inhibition of organosiloxane polymers (e.g., RLOBC) can be overcome by pre-treatment with an appropriate vapor phase catalyst (e.g., APTMS), providing a method for rapid curing of those polymers, notwithstanding the formulation of those polymers with materials that inhibit cross-linking and curing. These data also demonstrated that the uncured (and apparently the cured) resin linear organosiloxane block copolymer films are permeable to various chemical species in vapor phase, which in turn have the ability to modify its modulus by 5 to 6 orders of magnitude. The data indicate that by exposing the RLOBC films to different vapor phase

TABLE II

Curing Profiles of Cool White Film 5700K

| Pre-treatment | Peak Values At 150° C. | After 10 Min. At 150° C. | After 20 Min. At 150° C. | Observations |
|---|---|---|---|---|
| None | G' = 26 KPa<br>Tan (δ) = 1.6 | G' = 60 KPa<br>Tan (δ) = 1.24 | G' = 90 KPa<br>Tan (δ) = 1.07 | |
| 15 Min. APTMS | G' = 735 KPa<br>Tan (δ) = 0.38 | G' = 780 KPa<br>Tan (δ) = 0.27 | G' = 870 KPa<br>Tan (δ) = 0.24 | Stiff room temperature film |

TABLE II-continued

Curing Profiles of Cool White Film 5700K

| Pre-treatment | Peak Values At 150° C. | After 10 Min. At 150° C. | After 20 Min. At 150° C. | Observations |
|---|---|---|---|---|
| 15 Min. APTMS + 90 Sec. N$_2$ Plasma | G' = 3.17 MPa Tan (δ) = 0.31 | G' = 4.8 MPa Tan (δ) = 0.19 | G' = 5.2 MPa Tan (δ) = 0.17 | Stiff room temperature film |

Accordingly, exposure of the uncured RLOBC "cool white" (5700 K) film to vapor phase APTMS catalyst resulted in an increase of the storage modulus (G') after 20 minutes at 150° C. from 90 KPa to 870 KPa, and a decrease in tan (δ) from 1.07 to 0.24. These data reveal a rate of change of about 10 KPa/min. and at least a ten-fold increase in G' after pre-treatment of the uncured film by exposure to vapor phase APTMS and overcoming inhibition from the presence of phosphor in film formulation tested.

The data also reveal that pre-treatment of the uncured RLOBC film formulated with "cool white" (5700K) phosphors by exposure to vapor phase APTMS and N$_2$ plasma resulted in an increase in G' from 26 KPa and tan (δ) of 1.6 (at 150° C.) in the control to a material with a G' of 3170 KPa and tan (δ) of 0.31.

These data indicate that the structure of the cured, cross-linked additive-containing RLOBC film formulated with "cool white" (5700 K) phosphors can be manipulated over an extremely wide range by pre-treatment of the uncured materials with vapor phase catalysts and/or plasmas.

Example 5: Curing Warm White (2700 K) Films Pre-Treated with AETMS, or AETMS+N$_2$ Plasma In this experiment, uncured RLOBC films with "warm white" (2700K) phosphor mixtures including a nitride phosphor were pre-treated by exposure to vapor phase AETMS alone, or were pre-treated by exposure to vapor phase AETMS as well as to a N$_2$ plasma, before thermal curing/cross-linking. The data obtained in this study are presented in FIG. 7A and FIG. 7B.

Figure 7A:
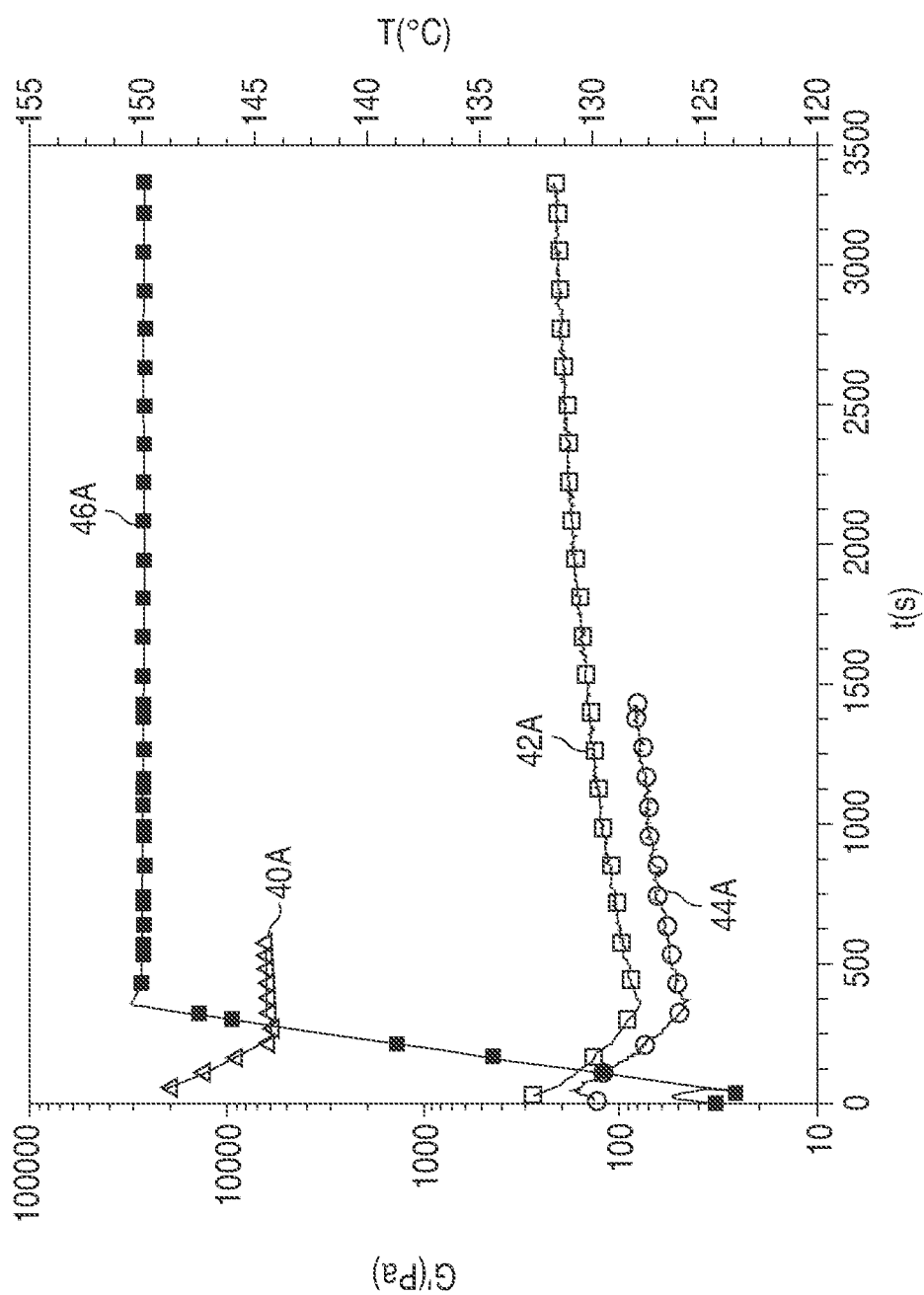
FIG. 7A depicts the effect of pre-treatment of uncured RLOBC films formulated with a phosphor mixture including a Nitride Phosphor for "warm white" emission (2700K emission) at the indicated temperatures, as a function of time (in seconds), as reflected by changes in the storage modulus (G') (left vertical (y) axis) in Pascal units values. (□) symbols: pre-treatment with vapor phase acetyl-ethylt-rimethoxyoxysilane (AETMS); (○) symbols: pre-treatment with vapor phase acetyl-ethyltrimethoxyoxysilane (AETMS) and an RF $N_2$ plasma; (Δ) symbols: untreated control.
Figure 7B:
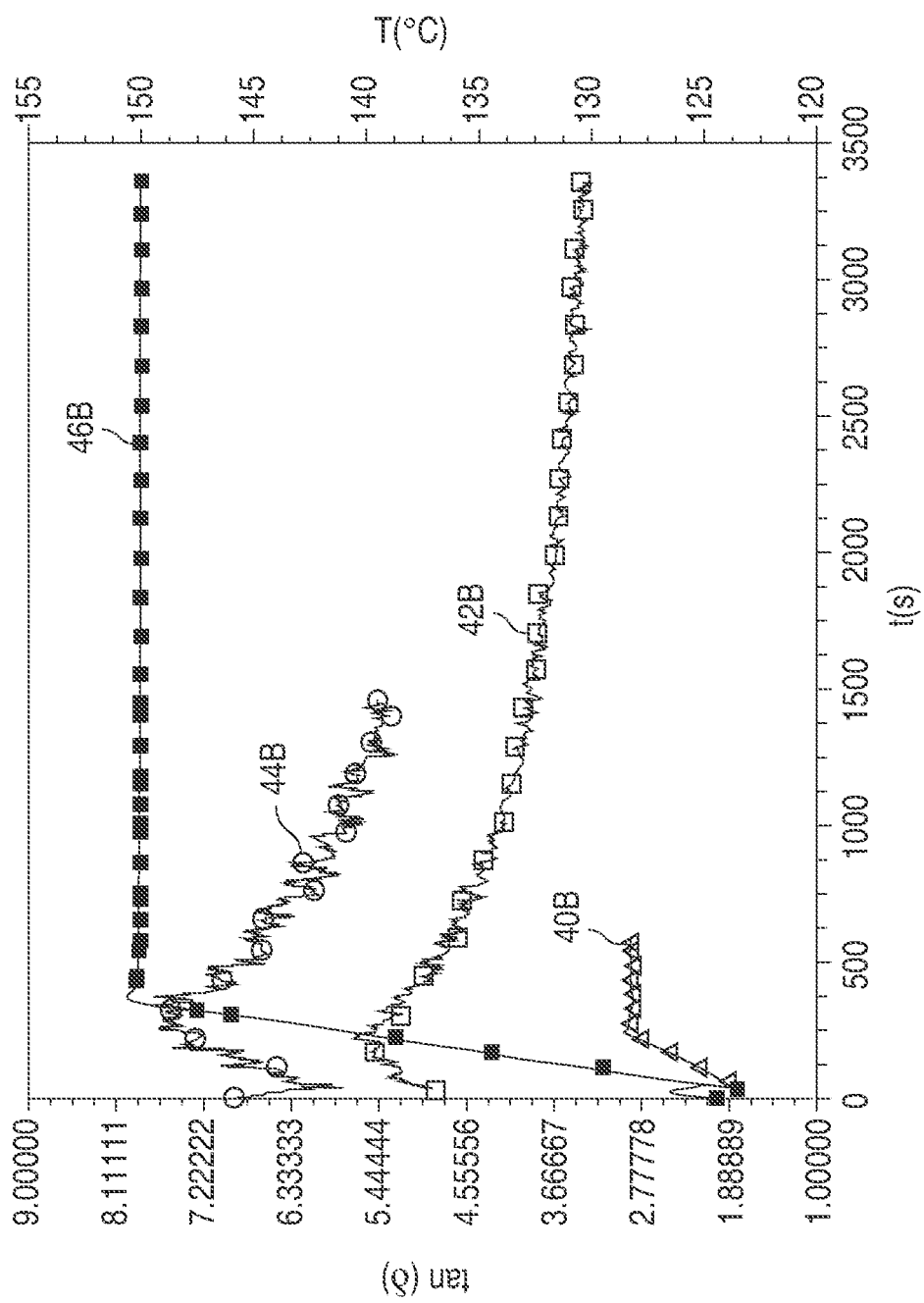
FIG. 7B depicts the effect of pre-treatment of uncured RLOBC films formulated with a phosphor mixture including a Nitride Phosphor for "warm white" emission (2700K emission) at the indicated temperatures, as a function of time (in seconds), as reflected by changes in tan (δ) values. (□) symbols: pre-treatment with vapor phase acetyl-ethylt-rimethoxyoxysilane (AETMS); (○) symbols: pre-treatment with vapor phase acetyl-ethyltrimethoxyoxysilane (AETMS) and an RF $N_2$ plasma; (Δ) symbols: untreated control.

As indicated in FIG. 7A and FIG. 7B, the samples were subjected to a temperature ramp progressing from about 125° C. to 150° C. over a period of approximately 6.5 minutes followed by an isothermal stage at 150° C. lasting about 50 minutes. Temperature is illustrated by curve 46A in FIG. 6A and curve 46B in FIG. 7B. Curve 42A in FIG. 7A, curve 42B in FIG. 7B, and the □ symbols represent those samples pre-treated with vapor phase AETMS alone. Curve 44A in FIG. 7A, curve 44B in FIG. 7B, and the ○ symbols represent those samples pre-treated with vapor phase AETMS followed by exposure to a N$_2$ plasma. Curve 40A in FIG. 7A, curve 40B in FIG. 7B, and the Δ symbols represent the untreated control sample (i.e., without either pre-treatment).

Selected values for G' and tan (δ) obtained in this experiment are included in Table I above.

Pre-treatment of an uncured organosiloxane polymer (e.g., a RLOBC formulated film with "warm white" (2700K) phosphors with either vapor phase acetoxyethyl trimethoxysilane (AETMS) or vapor phase AETMS and a N$_2$ plasma, results in marked inhibition of curing/cross-linking or plasticizing of those organosiloxane polymers. Again, in contrast to the results noted above with the primary amine APTMS, use of different functional vapor phase trimethoxy silane reagent (AETMS), yielded results that were extraordinarily different. Instead of crosslinking, this material softened more than 100-fold upon curing after pre-treatment with AETMS. The data provided above therefore, demonstrate that judicious selection and/or combination of one or more of the vapor phase materials and methods disclosed herein can be used for modulation and passivation of the curing of siloxane polymer materials, including organosiloxane polymer and RLOBC materials, which can be incorporated into methods for the manufacture of products employing encapsulation technologies and applications, including, but not limited to, light emitting devices, e.g. LEDs.

Example 6: Post-Cure Aging Inhibition of Acid-Catalyzed RLOBC Film Containing a Nitride Phosphor The films in this example were cast from an acid-catalyzed resin and cured for 4 h. at 150° C. before vapor infusion and post-cure aging process. Post-cure aging consisted in holding the post-cured films (with and without vapor infusion) in the rheometer chamber at 150° C. For one hour. In this example the films were formulated with Nitride phophors to achieve 2700 K (warm white, or WW) in an LED. Because the parent resin was catalyzed by an acid reagent, this example illustrates that the infusion of the film with a limited amount of an organic base (BisDMADES) (10 min 0.66 mm Hg, 50° C.) is capable to arrest or quench the continuation of crosslinking. Furthermore, this example also shows that post-curing crosslinking can be reactivated and even accelerated by increasing the exposure of the films to the same vapor-phase reagent (BisDMADES, two cycles of 10 minutes 0.66 mm Hg, 50° C.).

Figure 8A:
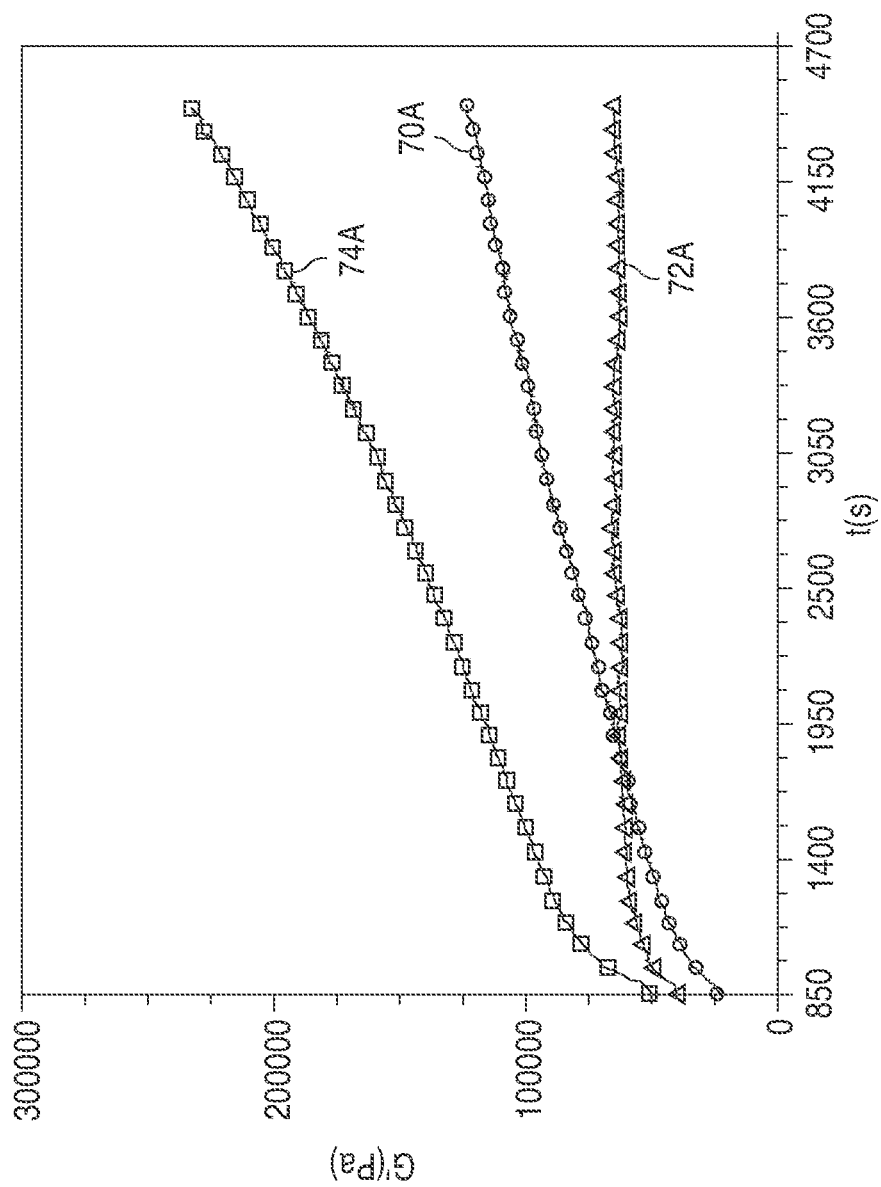
FIG. 8A depicts the shear moduli (G') evolution under Isothermal aging (150° C.) of three films formulated with a phosphor mixture including a Nitride Phosphor for LED emission corresponding to ca. 2700K (warm white, or WW). The films were cast from acid-catalyzed resin and cured for 4 h. at 150° C. before the aging test. (○) symbols: post-cure G' increase caused by continuing crosslinking of the acid-catalyzed film after cure. (Δ) symbols: a similar film vapor-infused with a moderate dose of BisDMADES (0.66 torr for ten minutes) applied after the untreated film was cured; (□) symbols: similar film vapor-infused with an additional dose of BisDMADES (twice 0.66 torr for ten minutes) applied after the untreated film was cured.
Figure 8B:
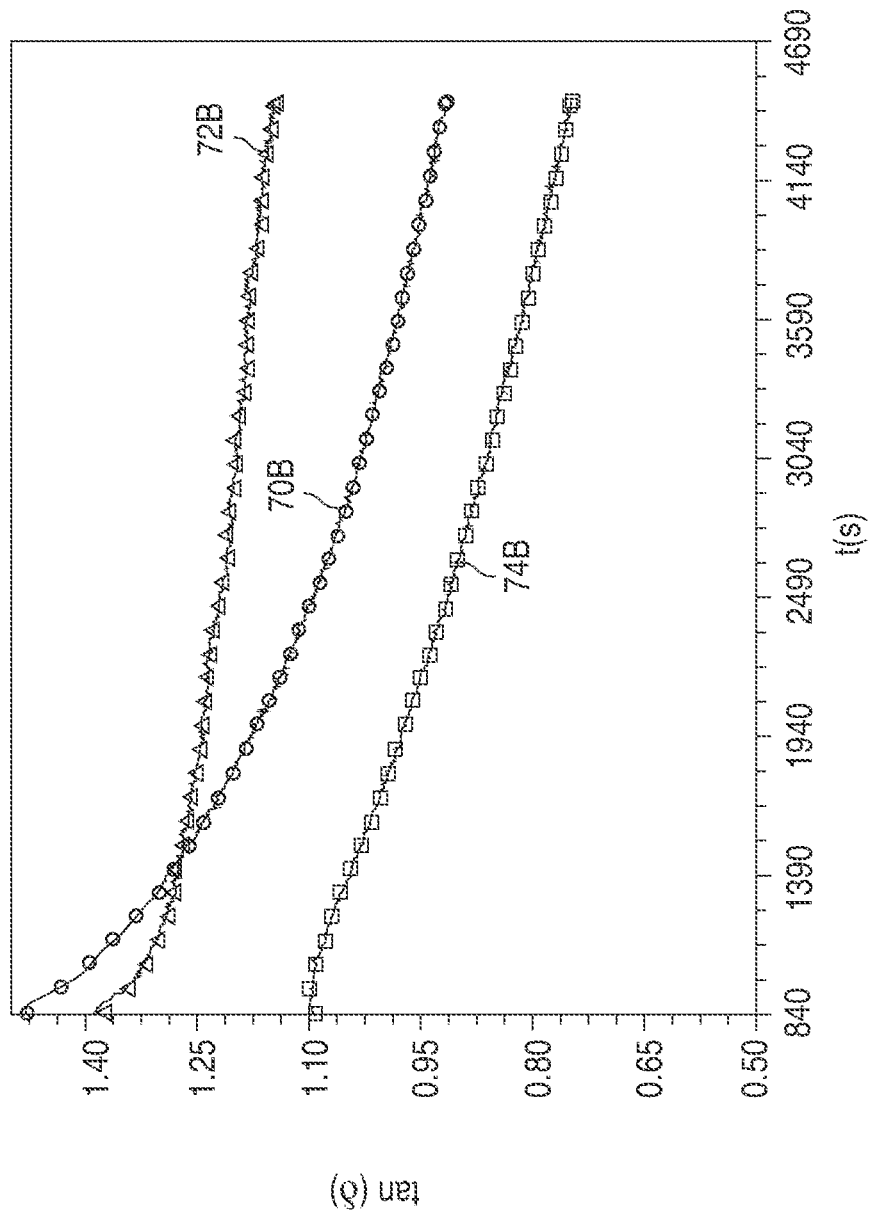
FIG. 8B depicts the tan (δ) evolution during Isothermal aging (150° C.) of the films described in FIG. 8A. (○) symbols: post-cure tan (δ) monotonic decrease caused by continuing crosslinking of the acid-catalyzed film after cure (Δ) symbols: a similar film that was vapor-infused with a moderate dose of the base catalyst applied after cure; (□) symbols a similar film that was vapor-infused after cure with a high dose of the base catalyst.

The results are illustrated in FIGS. 8A (G' vs. time at constant temperature, 150° C.) and 8B (tan (δ) vs time at constant temperature 150° C.). In these figures, curve 70A in FIG. 8A, curve 70B in FIG. 8B, the open circles (WW film No-Vapor) show post-cure G' increase and tan (δ) decrease caused by continuing crosslinking of the acid-catalyzed film after cure. Curve 72A in FIG. 8A, curve 72B in FIG. 8B, the open triangles (Vapor Passivation) correspond to a similar film vapor-infused with a moderate dose of BisDMADES after cure (0.66 torr for ten minutes), curve 74A in FIG. 8A, curve 74B in FIG. 8B, and the open squares (Vapor Reactivation) correspond to a similar film vapor-infused with an additional dose of BisDMADES after cure (twice 0.66 torr for ten minutes). The Vapor Passivation film (triangles) exhibits one order of magnitude slower rate of aging (~2 Pa/s) than the "No Vapor" (circles) film (~20 Pa/s). We attribute this behavior to the base neutralization of the post-cure remaining acid from the original film formulation. On the other hand the "Vapor Reactivation" film (squares) exhibits a significant faster rate of G' increase (~77 Pa/s) than the "No Vapor" film. We attribute this behavior to the infusion of excess base relative to the remaining post-cure acid.

Amongst others, herein the following embodiments are provided:

1. A method comprising: contacting a material with a first catalyst in a vapor phase, the material comprising: an uncured polymer; a second catalyst; and particles that inhibit the second catalyst; and after said contacting a material, curing the uncured polymer.

2. The method of embodiment 1 wherein the material is formed into a film.

3. The method of embodiment 2 further comprising laminating the film over a light emitting diode.

4. The method of embodiment 1 wherein the first catalyst comprises an acid.

5. The method of embodiment 1 wherein the first catalyst comprises a base.

6. The method of embodiment 1 wherein the particles that inhibit the second catalyst comprise a wavelength converting material.

7. The method of embodiment 1 wherein curing the uncured polymer comprises causing a process that crosslinks the polymer, the method further comprising after causing a process that crosslinks the polymer, contacting the material with a second catalyst in a vapor phase, wherein the second catalyst retards the process that crosslinks the polymer.

8. The method of embodiment 1 wherein: the uncured polymer comprises a siloxane; and curing comprises causing one of ring-opening polymerization and condensation polymerization.

9. A method comprising: providing a film comprising an uncured polymer and a particle of material; contacting the film with a catalyst in a vapor phase such that the catalyst infuses into the film; and after said contacting the film, curing the uncured polymer.

10. The method of embodiment 9 wherein the infused catalyst at least partially decomposes during or after said curing the uncured polymer.

11. The method of embodiment 9 wherein the infused catalyst at least partially volatilizes during or after said curing the uncured polymer.

12. The method of embodiment 9 wherein the infused catalyst is not irreversibly incorporated into the film.

13. The method of embodiment 9 wherein prior to said contacting the material, the material is substantially free of catalyst.

14. The method of embodiment 9 wherein the particles of material are particles of wavelength converting material.

15. The method of embodiment 14 wherein providing a film comprises mixing the particles of wavelength converting material with the uncured polymer and casting the mixture into a film.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

The term "substantially" herein, such as in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to". The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

What is being claimed is:

1. A method comprising:
   contacting a solid viscoelastic film with a first catalyst that is in a vapor phase, the solid viscoelastic film comprising an uncured polymer; and
   curing the uncured polymer after the solid viscoelastic film is contacted with the first catalyst to provide a cured polymer,
   laminating the solid viscoelastic film over a light emitting device.

2. The method of claim 1, wherein the light emitting device is a light emitting diode.

3. The method according to claim 2, wherein:
   the solid viscoelastic film further comprises a second catalyst and particles, and
   the second catalyst is inhibited by the particles.

4. The method according to claim 1, wherein the first catalyst comprises one or more of 1,8-diazabicyclo[5.4.0]undec-7-ene (DBU), bis(dimethylamino)diethylsilane (Bis-DMADES), and aminopropyl trimethoxysilane (APTMS).

5. The method according to claim 1, wherein the first catalyst comprises one or more of pyridine and acetoxyethyl trimethoxysilane (AETMS).

6. The method according to claim 1, wherein the first catalyst comprises one or more of an acid and a base.

7. The method according to claim 1, further comprising contacting the cured polymer with an inhibitor that retards further crosslinking occurring after the curing of the uncured polymer.

8. The method according to claim 1, wherein:
the uncured polymer comprises a siloxane; and
curing the uncured polymer comprises causing one of ring-opening polymerization and condensation polymerization.

9. The method according to claim 1, wherein the first catalyst is not irreversibly incorporated into the solid viscoelastic material.

10. The method according to claim 1, further comprising exposing the solid viscoelastic film to a plasma during or following contacting the solid viscoelastic film with the first catalyst, but prior to curing the uncured polymer, under conditions sufficient to provide the uncured treated polymer.

11. The method according to claim 1, wherein the solid viscoelastic film further comprises particles dispersed within.

12. A method comprising:
providing a solid viscoelastic material comprising an uncured polymer and a particle of wavelength converting material;
contacting the solid viscoelastic material with a catalyst that is in a vapor phase; and
curing the uncured polymer after contacting the solid viscoelastic material to provide a cured polymer.

13. The method according to claim 12, wherein the solid viscoelastic material is a film, contacting the solid viscoelastic material comprises infusing the film with the catalyst, and the infused catalyst at least partially decomposes or partially volatizes during or after curing the uncured polymer.

14. The method according to claim 13, wherein the infused catalyst is not irreversibly incorporated into the film.

15. The method according to claim 13, wherein prior to said contacting the film, the film is substantially free of the catalyst.

16. The method according to claim 13, further comprising exposing the film to a plasma during or following contacting the solid viscoelastic material, but prior to curing the uncured polymer, under conditions sufficient to provide the uncured treated polymer.

17. The method according to claim 12, wherein providing the solid viscoelastic material comprises mixing the particles of wavelength converting material with the uncured polymer.

18. The method according to claim 12, wherein the uncured polymer comprises an uncured organosiloxane polymer, and wherein the catalyst comprises one or more of 1,8-diazabicyclo[5.4.0]undec-7-ene (DBU), bis(dimethylamino)diethylsilane (Bis-DMADES), and aminopropyl trimethoxysilane (APTMS).

19. The method according to claim 12, wherein the catalyst comprises one or more of pyridine and acetoxyethyl trimethoxysilane (AETMS).

20. The method according to claim 12, further comprising contacting the cured polymer with an inhibitor that retards further crosslinking occurring after the curing of the uncured polymer.

* * * * *